United States Patent
Okuyama et al.

(10) Patent No.: US 7,540,079 B2
(45) Date of Patent: Jun. 2, 2009

(54) LAMINATED MEMBER FOR CIRCUIT BOARD, METHOD AND APPARATUS FOR MANUFACTURING OF CIRCUIT BOARD

(75) Inventors: Futoshi Okuyama, Otsu (JP); Yoichi Shinba, Otsu (JP); Tetsuya Hayashi, Izumiotsu (JP); Takayoshi Akamatsu, Otsu (JP)

(73) Assignee: Toray Industries, Inc., Tokyo (JP)

( * ) Notice: Subject to any disclaimer, the term of this patent is extended or adjusted under 35 U.S.C. 154(b) by 351 days.

(21) Appl. No.: 10/542,851

(22) PCT Filed: Jan. 21, 2004

(86) PCT No.: PCT/JP2004/000475
§ 371 (c)(1),
(2), (4) Date: Jul. 21, 2005

(87) PCT Pub. No.: WO2004/066694
PCT Pub. Date: Aug. 5, 2004

(65) Prior Publication Data
US 2006/0131260 A1   Jun. 22, 2006

(30) Foreign Application Priority Data

| Jan. 23, 2003 | (JP) | ............ 2003-015026 |
| Feb. 4, 2003 | (JP) | ............ 2003-026797 |
| Feb. 4, 2003 | (JP) | ............ 2003-026798 |

(51) Int. Cl.
*H05K 3/36* (2006.01)

(52) U.S. Cl. .............. 29/830; 29/832; 29/846

(58) Field of Classification Search ............ 29/830, 29/832–841, 846–853
See application file for complete search history.

(56) References Cited

U.S. PATENT DOCUMENTS

2004/0026363 A1   2/2004   Akamatsu et al. ............. 216/13

FOREIGN PATENT DOCUMENTS

| JP | 51-90837 | 7/1976 |
| JP | 62-56245 A | 3/1987 |

(Continued)

OTHER PUBLICATIONS

Machine translation of JP2001-351950.*

*Primary Examiner*—Jeremy C Norris
(74) *Attorney, Agent, or Firm*—Kubovcik & Kubovcik

(57) ABSTRACT

A circuit board-use member has a reinforcing plate, a removable organic layer, a flexible film having a circuit pattern, and a peeling-assist layer laminated in that order;
  a method forms a circuit board by forming a circuit pattern on a flexible film which is adhered to a reinforcing plate with a removable organic layer interposed therebetween, and peeling the film from the plate at an angle ranging from more than 0° to 80°; and
  an apparatus for forming a circuit board has one of a separation means for separating the flexible film from the reinforcing plate while the film contacts a curved support body;
  a curved separation means for separating the reinforcing plate from a support body for the flexible film while the plate is curved; or a moving means for relatively moving holding means and peeling means having a wedge-shaped member for peeling the flexible film.

11 Claims, 20 Drawing Sheets

FOREIGN PATENT DOCUMENTS

| | | |
|---|---|---|
| JP | 5-147819 A | 6/1993 |
| JP | 5-319675 A | 12/1993 |
| JP | 7-215577 A | 8/1995 |
| JP | 7-315682 A | 12/1995 |
| JP | 9-194128 A | 7/1997 |
| JP | 2001-89018 A | 4/2001 |
| JP | 2001-351950 A | 12/2001 |
| JP | 2002-104726 A | 4/2002 |
| JP | 2002-128388 A | 5/2002 |
| JP | 2002-282832 A | 10/2002 |

* cited by examiner

LAMINATED MEMBER FOR CIRCUIT BOARD, METHOD AND APPARATUS FOR MANUFACTURING OF CIRCUIT BOARD This application is a 371 of international application PCT/JP2004/000475, which claims priority based on Japanese patent application Nos. 2003-15026, 2003-26797 and 2003-26798 filed Jan. 23, Feb. 4 and Feb. 4, 2003, respectively, which are incorporated herein by reference.

TECHNICAL FIELD

The present invention relates to a circuit board-use member which uses a flexible film having a highly precise circuit pattern, a method for forming a circuit board composed of a flexible film having a highly precise circuit pattern, and an apparatus for forming the same.

BACKGROUND ART

Concomitant with the reduction in size and weight of electronic products, higher precision in patterning of printed circuit boards has been required. Since flexible film substrates can be bent, which enables three-dimensional wiring, they are suitable for reduction in size of electronic products; hence, the demand for flexible film substrates is increasing. In TAB (tape automated bonding) techniques which are used for connecting ICs to liquid crystal display panels, by processing a relatively narrow, polyimide film substrate, a significantly excellent fine pattern as a resin substrate can be obtained. However, the development of micro-fabrication is practically reaching its limits. In order to evaluate miniaturization, an index represented by the line width and the space between lines, and an index represented by the position of the pattern on the substrate are used. With respect to the line width and the space between lines, further miniaturization may be possible. The latter index, i.e., the dimensional accuracy, relates to the alignment accuracy between a circuit board pattern and electrode pads when the circuit board and electronic components, such as ICs, are connected to each other, and as the pitch between electrode pads of ICs is further narrowed and the number of pins is increased, it becomes difficult to meet the required accuracy. That is, when an IC having more than 400 to 1,000 pins is connected to a circuit pattern, extremely high dimensional accuracy is required to align all the pins with fine electrode pads of the circuit pattern with a pitch of 40 µm or less and preferably 30 µm or less.

It is, in particular, difficult to improve the dimensional accuracy of flexible film substrates. In the circuit board fabrication, heat treatment processes, such as drying and curing, and wet processes, such as etching and development, are performed, and hence the flexible film is repeatedly subjected to expansion and shrinkage. The hysteresis during the fabrication processes mentioned above causes dimensional change of the circuit pattern on the substrate. In addition, when a plurality of processes requires alignment, if expansion and shrinkage occur during such processes, misalignment occurs between patterns to be formed. The deformation of the flexible film due to expansion and shrinkage has a more serious influence on an FTC (Flexible Printing Circuit) in which a substrate having a relatively large work-size is processed. In addition, dimensional change and misalignment are also caused by external forces, such as tension and torsion, and, in particular, when a thin substrate is used to increase flexibility, adequate care must be taken.

In addition, a proposal (International Publication No. WO 03/009657 pamphlet) for forming a circuit board has been made which is performed by adhering a flexible film onto a reinforcing plate with an organic layer interposed therebetween to maintain the dimensional accuracy, forming a very fine circuit pattern, and then peeling away the flexible film from the reinforcing plate. However, it has not been clearly disclosed that when the flexible film is peeled away from the reinforcing plate, by using a particular structure and method, the accuracy of the flexible film and that of the circuit pattern provided thereon are maintained, and that the peeling is performed while curling, bending and the like of the film is being prevented.

In addition, in peeling a flexible film in the past, in general, a rigid substrate was formed into a final product, and the flexible film was used as a protective film. Accordingly, the quality of the flexible film after peeled away has not been particularly considered, and hence attention has been primarily paid to reliable peeling of the flexible film. In addition, although some flexible products are formed after peeled away from rigid substrates, in this case, efficiency of peeling operation is primarily emphasized, or a method is used in which the product is bent in order to decrease a peeling force. Hence, the concept has not been considered at all in which peeling is performed while the flatness and dimensional accuracy of a flexible film are being maintained (for example, peeling is performed without causing a strain of approximately several hundred micrometers).

On the other hand, in recent years, a proposal has been made in which a very fine pattern is formed by adhering a flexible film to a reinforcing plate in order to maintain the dimensional accuracy. Since a circuit pattern of a flexible film substrate is used after the flexible film is peeled away from a reinforcing plate, the change in dimension of the circuit pattern generated when it is peeled away from the reinforcing substrate is preferably reduced to several tens micrometers or less. Hence, a peeling method has been desired in which a stress applied to a flexible film for peeling is decreased as small as possible.

As a method for peeling a flexible film from a rigid substrate, methods have been disclosed in which a flexible film is peeled away while a rigid plate is being held. As particular examples, for example, there may be mentioned methods for peeling a flexible film by lifting up an end portion thereof while the end portion of the flexible film is held (for example, see Japanese Unexamined Patent Application Publication No. 7-315682), while a pressure-sensitive adhesive tape is pressed onto the surface of the flexible film (for example, see Japanese Unexamined Patent Application Publication No. 5-319675), and while a peel angle formed between the rigid substrate and the flexible film is maintained obtuse (for example, see Japanese Unexamined Patent Application Publication No. 2002-104726). In addition, for example, there may also be mentioned a method (for example, see Japanese Unexamined Patent Application Publication No. 7-215577) in which a flexible film is peeled away from a peeling roller using a scraper after the flexible film is transferred onto the peeling roller. However, in all the methods described above, the flexible film used as a protective film is peeled away from a product, and a method for peeling a flexible film having a very fine pattern formed thereon without degrading the dimensional accuracy and flatness has not been described at all.

DISCLOSURE OF INVENTION

In view of the conventional problems described above, thorough intensive research carried out on a flexible film circuit board having a highly precise circuit pattern, a method for forming a circuit board composed of a flexible film having a highly precise circuit pattern, and an apparatus for forming the circuit board, it was found that the problems described above can be solved by forming a circuit pattern on a flexible film while it is adhered onto a reinforcing plate having excellent dimensional stability with a removable organic layer interposed therebetween, followed by peeling of the flexible film provided with the circuit pattern thereon using a particular structure or a particular method, and hence further research on particular and preferable embodiments was conducted.

That is, the present invention relates to a circuit board-use member having a reinforcing plate, a removable organic layer, a flexible film having at least one circuit pattern on at least one of two surfaces, and a peeling-assist layer laminated in that order;

a method for forming a circuit board, which has the steps of forming a circuit pattern on a surface of the flexible film adhered to a reinforcing plate with a removable organic layer interposed therebetween, the surface being opposite to that adhered to the reinforcing plate, and then peeling the flexible film, in which the flexible film is peeled away from the reinforcing plate while a peel angle is being maintained in the range of more than 0° to 80°; and an apparatus for forming a circuit board in which the flexible film is peeled away from a flexible film substrate composed of a flexible film provided with a circuit pattern and adhered to a reinforcing plate, the apparatus having one of i) curved separation means for separating the flexible film from the reinforcing plate while the flexible film is being in contact with a curved support body, ii) curved separation means for separating the reinforcing plate from a support body supporting the flexible film while the reinforcing plate is being curved, and iii) moving means for relatively moving holding means and peeling means, the holding means for holding a circuit board-use member, and the peeling means having a wedge-shaped peeling part for peeling the flexible film.

Figure 1:
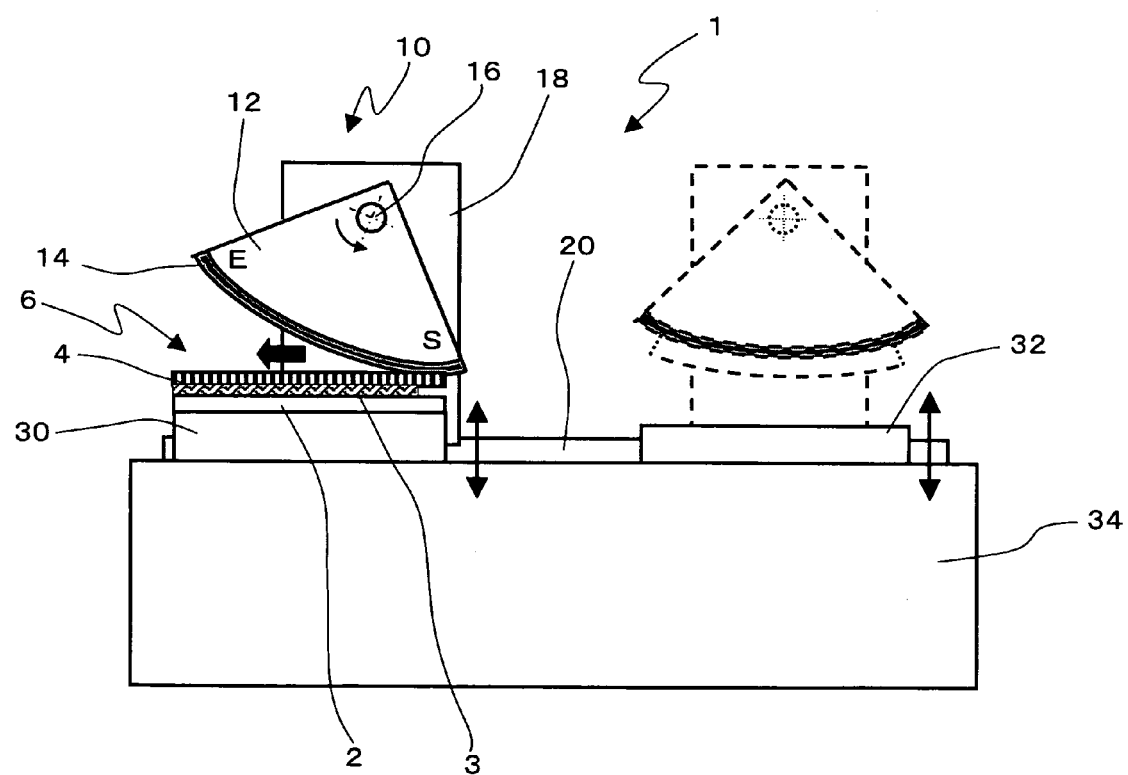
FIG. 1 is a schematic front view of a peeling apparatus according to the present invention.

Reference numerals 1, 60, 80, 100, and 150 each indicate a peeling apparatus. Reference numerals 2, 3, and 4 indicate a reinforcing plate, a removable organic layer, and a flexible film, respectively, and reference numeral 6 indicates a flexible film substrate composed of the reinforcing plate, the removable organic layer, and the flexible film. Reference numerals 30, 61, 81, 103, and 201 each indicate a loading table, and reference numerals 12 and 14 indicate a support body and a holding portion holding the flexible film, respectively. Reference numeral 22 indicates a holding mean. Reference numeral 5 indicates an electronic component, and reference numerals 36 and 91 each indicate a recess portion in which the electronic component is received. Reference numeral 38 indicates a peel angle of the flexible film.

Reference numeral 66 indicates a body of rotation, and reference numeral 65 indicates a holding portion holding the reinforcing plate. Reference numeral 70 indicates a holding mean. Reference numerals 85 and 86 indicate a press roller and a lift roller, respectively.

Reference numerals 106b and 106c indicates a holder and a wedge, respectively.

Reference numerals 152, 156, 160, and 162 indicate a linear scale, an electromagnetic clutch, a motor, and a controller, respectively.

Reference numeral 200 indicates a laminator. Reference numerals 202, 201, 203, 204, and 215 indicate a film holding sheet, a loading table, a squeegee, an electrostatic charging device, and a support pillar, respectively.

BEST MODE FOR CARRYING OUT THE INVENTION

One aspect of the present invention is a circuit board-use member formed of a reinforcing plate, a removable organic layer, a flexible film having at least one circuit pattern on at least one of two surfaces, and a peeling-assist layer laminated in that order.

The flexible film of the present invention is a plastic film, and it is important that the film has heat resistance withstanding thermal processes performed in a step of forming circuit patterns and in a step of mounting electronic components. As the films, for example, there may be used polycarbonate, poly(ether sulfide), poly(ethylene terephthalate), poly(ethylene naphthalate), poly(phenylene sulfide), polyimide, polyamide, and liquid crystal polymer films. Among those mentioned above, polyimide films are preferably used due to its superior resistance to chemicals besides excellent heat resistance. In addition, since having excellent electrical properties such as a low dielectric loss, liquid crystal polymers are preferably used. Flexible glass-fiber reinforced resin sheets may also be used.

As resins for the glass-fiber reinforced resin sheets described above, for example, epoxy resins, poly(phenylene sulfide), poly(phenylene ether), maleimide (co)polymer resins, polyamides, and polyimides may be mentioned. The thickness of the flexible film is preferably small in view of reduction in size and weight of electronics apparatuses and in view of formation of fine via-holes and is preferably large in order to ensure mechanical strength and maintain flatness; hence, the thickness is preferably in the range of 4 to 125 µm.

In the present invention, as a substrate used as the reinforcing plate, for example, there may be used inorganic glasses such as soda-lime glass, borosilicate glass, and quartz glass; ceramics, such as alumina, silicon nitride, and zirconia; metals such as stainless steel, invar alloys, and titanium; and glassfiber reinforced resin sheets. Although all of these materials are preferably used because of their small coefficient of thermal expansion and small coefficient of hydroscopic expansion, inorganic glasses are more preferably used. The reasons for this are that the heat resistance and resistance to chemicals in a circuit pattern-forming step are excellent, a large-area substrate having a satisfactory surface smoothness is easily obtained at a reasonable price, plastic deformation is unlikely to occur, and particles are unlikely to be generated by contact which occurs during transportation. Among the inorganic glasses, a borosilicate glass represented by aluminoborosilicate glass is most preferably used since it has a high elastic modulus and a small coefficient of thermal expansion.

When a metal or a glass-fiber reinforced resin is used as the reinforcing plate, although formation may be performed by reel to reel process, continuous sheet; however, since the dimensional accuracy can be easily ensured, the circuit board of the present invention is preferably formed by a single sheet process. In addition, in mounting electronic components, the single sheet process is also preferably performed since alignment is easily performed with high accuracy by using optical position detection, a movable stage, and the like. In this embodiment, the single sheet process indicates a process in which, instead of a long, continuous sheet, a plurality of sheets is handled sheet by sheet.

When a glass substrate is used as the reinforcing plate, if the glass substrate has a small Young's modulus or the glass substrate is thin, since warpage and torsion are increased by the expansion and shrinkage of the flexible film, the glass substrate may be cracked in some cases when being performed vacuum-suction onto a flat stage. Additionally, since the flexible film is deformed by vacuum-suction and release, it tends to be difficult to ensure the dimensional accuracy. On the other hand, if the glass substrate is thick, the flatness may be degraded due to non-uniform thickness in some cases, resulting in degradation in exposure accuracy. In addition, since handling load by a robot or the like increases, it becomes difficult to transfer substrates quickly, and hence, besides decrease in productivity, transportation cost is increased. In consideration of the points described above, the thickness of a glass substrate used as a single-sheet reinforcing plate (which, is to be treated by a single sheet process) is preferably in the range of 0.3 to 1.1 mm.

When a metal substrate is used as the reinforcing plate, if the metal substrate has a small Young's modulus or the metal substrate is thin, since warpage and torsion are increased by the expansion and shrinkage of the flexible film, it becomes impossible to perform vacuum-suction of the substrate onto a flat stage, or since the flexible film is deformed in accordance with the warpage and torsion of the metal substrate, it becomes difficult to ensure the dimensional accuracy. In addition, if bending occurs, the flexible film is immediately rejected as a defect. On the other hand, if the metal substrate is thick, flatness may be degraded in some cases due to non-uniform thickness, resulting in degradation in exposure accuracy. In addition, since handling load by a robot or the like increases, it becomes difficult to transfer substrates quickly, and hence, besides decrease in the productivity, transportation cost is also increased. Accordingly, the thickness of a metal substrate used as the single-sheet reinforcing plate is preferably in the range of 0.1 to 0.7 mm.

The removable organic layer used in the present invention is composed of an adhesive or a pressure-sensitive adhesive and is not particularly limited as long as it adheres the flexible film to the reinforcing plate, and after processing is performed, the flexible film can be peeled away from the reinforcing plate. As the adhesive or pressure-sensitive adhesive, for example, an acryl or a urethane-based pressure-sensitive adhesive, which is a so-called removable adhesive, may be mentioned. The adhesive preferably has an adhesion in a so-called weak adhesion range in order to obtain a sufficient adhesion when the flexible film is processed, and to easily peel away the flexible film, to prevent strain from being generated in the flexible film substrate. A silicone resin or an epoxy resin film having tackiness may also be used as the removable organic layer.

In addition, an adhesive having adhesion to be decreased in a low temperature region, an adhesive having adhesion to be decreased by ultraviolet irradiation, or an adhesive having adhesion to be decreased by heat treatment may also be preferably used. Among those mentioned above, the adhesive having adhesion to be decreased by ultraviolet irradiation is more preferably used since the change in adhesion is significant before and after the ultraviolet irradiation, and due to crosslinking of the adhesive caused by ultraviolet irradiation before bonding of electronic components performed under high temperature and high pressure conditions, softening due to the temperature and deformation due to the pressure can be preferably suppressed. In addition, in order to ensure resistance to chemicals and heat resistance in a process for forming a circuit pattern, crosslinking of the adhesive by ultraviolet irradiation is preferably performed prior to the start of a wet process and a heating process in the process for forming a circuit pattern. As the adhesive having adhesion or tackiness to be decreased by ultraviolet irradiation, a two-component cross-linkable acrylic-based pressure-sensitive adhesive may be mentioned by way of example. In addition, as the adhesive having adhesion or tackiness to be decreased in a low temperature region, for example, there may be mentioned an acrylic-based pressure-sensitive adhesive which is reversibly transformed between the crystalline state and the non-crystalline state.

In the present invention, the adhesion is measured as a 180°-direction peel strength which is obtained when a flexible film having a width of 1 cm adhered to the reinforcing plate with the organic layer interposed therebetween is peeled away. The peel rate for measuring the adhesion is set to 300 mm/min. In the present invention, the adhesion is preferably in the range of 0.098 to 98 N/m.

When the removable organic layer or a photoresist is applied onto the substrate, a wet coating method may be used. As wet coating device, for example, various devices may be used, such as spin coaters, reverse coaters, bar coaters, blade coaters, roll coaters, die coaters, screen printing, dip coaters, and spray coaters; however, when the removable organic layer is directly applied to reinforcing plates to be processed by a single sheet process or a photoresist for forming a circuit board is directly applied to flexible film substrates to be processed by a single sheet process, a die coater is preferably used. That is, although a spin coater is generally used in the wet coating method for coating single-sheet substrates, the thickness of each substrate is controlled by the balance between a centrifugal force caused by high-velocity revolution of the substrate and the adsorbability to the substrate, and as a result, the utilization ratio of the coating solution is ineffectively low, such as 10% or less. In addition, since the centrifugal force is not applied to the center of rotation, although depending on types of coating solutions, it may be difficult to uniformly apply a thixotropic coating solution or a coating solution having a high viscosity onto the substrate. In addition, as for a reverse coater, bar coater, or blade coater, in order to obtain a stable coating thickness, a coating length of several tens of centimeters to several meters or more is generally required after the start of discharging the coating solution, and therefore, the use of the coaters described above for single-sheet substrates must be carefully considered. By a roll coater, screen printing, dip coater, and spray coater, high accuracy in coating thickness is difficult to obtain, and the tolerance for the flow characteristic of the coating solution is limited. In addition, by a roll coater, dip coater, and spray coater, a thick coating film is difficult to obtain. Hence, the devices mentioned above are not easily employed. As for a die coater, by combining an periodically driven metering pump, a mechanism for relatively moving a substrate and a coating head, and a system for comprehensively controlling the metering pump, the substrate, and the coating head, it is possible to suppress the nonuniformity of thickness of the film of the coating start section and the coating end section in the range of several millimeters to several tens of millimeters when single-sheet substrates are coated. As periodically driven metering pumps, for example, gear pumps and piston pumps may be mentioned. Since the removable organic layer generally has a higher viscosity than that of a photoresist, the use of a die coater is particularly preferable.

The removable organic layer may be directly applied to the reinforcing plate, or the removable organic layer may be applied to another base body, such as a long web, followed by transfer of the layer to the reinforcing plate. When a transfer method is employed, although only a portion having a uniform thickness can be advantageously used, it is disadvantageous since the number of steps is increased, and another base body used in the transfer step is required.

Alternatively, the removable organic layer may be applied to the flexible film used as the circuit board, followed by adhesion to the reinforcing plate.

After a circuit pattern is formed on the flexible film, peeling may be performed at the interface of the removable organic layer with the reinforcing plate or the flexible film. However, peeling is preferably performed at the interface between the removable organic layer and the flexible film since a step of removing the removable organic layer adhered to the flexible film can be omitted after the flexible film is peeled. When an auxiliary adhesion layer is provided between the reinforcing plate and the removable organic layer, more reliable peeling can be preferably performed at the interface between the removable organic layer and the flexible film.

The auxiliary adhesion agent preferably has strong adhesion to the reinforcing plate and the removable organic layer, and for example, silane, organotitanium, and organophosphorus auxiliary adhesion agents may be mentioned as a preferable agent. Examples of silane auxiliary adhesion agents include halogen silanes, alkoxy silanes, and acetoxy silanes, and examples of organotitanium auxiliary adhesion agents include titanium esters, titanium acilates, and titanium chelates. In addition, examples of organophosphorus auxiliary adhesion agents include mono-alkyl phosphate, alkyl phosphonates, and dialkyl phosphites. A silane auxiliary adhesion agent is preferably employed since it can be easily and flatly applied to the reinforcing plate and it is inexpensive. When the thickness of the auxiliary adhesion agent is excessively small, it is difficult to obtain sufficient adhesion, and when the thickness is excessively large, cracking or peeling is liable to occur; hence, the thickness is preferably in the range of 2 nm to 5 μm and more preferably in the range of 5 nm to 1 μm.

In the present invention, in order to improve the adhesion between the reinforcing plate and the removable organic layer, roughness may be formed on the reinforcing plate. If roughness is formed on the surface of the reinforcing plate to which the flexible film is adhered, the removable organic material enters the roughness, and adhesion to the reinforcing plate can be increased by an anchoring effect. As a method for forming roughness, for example, there may be mentioned sand blasting, chemical etching, or a method forming a film having roughness on the surface of the reinforcing plate; however, the method is not limited thereto. In chemical etching, the reinforcing plate is immersed in an acid or an alkaline aqueous solution so that the surface of the plate is etched, thus forming roughness. In particular, when the reinforcing plate is a glass substrate, since the reinforcing plate has high chemical resistance, high-concentration hydrogen fluoride or sodium hydroxide is preferably used. In addition, although a material for beads used in sand blasting is not particularly limited, since the reinforcing plate is generally composed of a hard material, a glass, a ceramic, a metal, or the like is preferably used. Additionally, if the particle size of the beads used in sand blasting is too small, kinetic energy sufficient for forming roughness cannot be obtained, and if the particle size is too large, dense roughness cannot be obtained; hence, the particle size is preferably in the range of 10 μm to 1 mm. In addition, as the method for forming a film having roughness on the surface of the reinforcing plate, a method may be mentioned by way of example in which a film is formed by mixing a foaming agent into a primary ingredient of the film, and the foaming agent is then foamed. Additionally, the following method may also be used in which a film is formed by mixing an additive, which is decomposed by heat, ultraviolet rays, or the like, into a primary ingredient of the film, and the additive is then removed by decomposition to form roughness.

If the degree of the roughness formed by the method described above is too small, sufficient adhesion cannot be obtained, and if the above degree is too large, the flatness is degraded. Therefore, the average surface roughness is preferably in the range of 100 nm to 5 μm, and more preferably in the range of 1 μm to 3 μm.

As the method for improving the adhesion between the reinforcing plate and the removable organic layer, the method for providing an auxiliary adhesive layer and the method for forming roughness on the surface of the reinforcing plate may be used alone or in combination.

Before being adhered to the reinforcing plate, the flexible film may be provided with at least one metal layer on at least one of two surfaces thereof. When being provided over the entire surface of the flexible film to which the reinforcing plate is adhered, the metal layer can be used as a ground layer for electromagnetic shielding when the circuit board is completed. Alternatively, when a patterned metal layer is provided on the surface of the flexible film to which the reinforcing plate is adhered, although the patterned metal layer cannot be formed to have a particularly highly precise pattern, in combination with a highly precise circuit pattern formed on the surface of the flexible film opposite to that to which the reinforcing plate is adhered, a double-sided circuit board can be realized. As merits of the double-sided circuit board, for example, there may be mentioned a larger degree of option in wiring design since intersection of wires can be realized via through-holes, reduction in noise of high speed LSIs since a ground potential can be transmitted to the vicinity of a necessary location with wide lines, prevention of decrease in potential even in high speed switching and stabilization of operation of LSIs since a source potential can be transmitted to the vicinity of a necessary location with wide wires as is the case described above, and shielding of external noise by function as the electromagnetic shielding. Hence, the double-sided circuit board can be very effectively used in the environment in which LSIs are operated at a higher speed, and the number of electrode pads is being increased by the requirement of multifunctionality.

In the present invention, before the flexible film is adhered to the reinforcing plate, an alignment mark is preferably formed on the surface of the flexible film, which is to be adhered to the reinforcing plate. When the reinforcing plate is transparent, the alignment mark may be read through the reinforcing plate or through the flexible film. However, when a metal layer is formed on the opposite surface to the adhering surface of the flexible film, the alignment mark is preferably read through the reinforcing plate because reading can be performed regardless of the pattern of the metal layer. This alignment mark may also be used for the alignment when the flexible film is adhered to the reinforcing plate. The shape of the alignment mark is not particularly limited, and any shape commonly used in aligners and the like may be preferably used.

The metal layer may be formed by adhering a metal foil, such as a copper foil, using an adhesive layer, and in addition to that described above, sputtering, plating, or combination thereof may also be used for forming the metal layer. Alternatively, a raw material resin or its precursor for the flexible film may be applied to a metal foil, such as a copper foil, followed by drying and curing, so that a flexible film provided with a metal layer is formed and is to be used for the purpose described above. As the metal layer, any metal having high conductivity may be used, and for example, gold, silver, or aluminum may also be used.

As the method for forming a circuit pattern composed of a metal, a full additive process, a semi-additive process, or a subtractive process may be used.

The full additive process is a process as described below. A surface on which a circuit pattern is to be formed is treated with a catalyst, such as palladium, nickel, or chromium, followed by drying. The catalyst in this case will not function as nuclei for plating growth as it is; however, the catalyst functions as the nuclei for plating growth after being activated. A photoresist is then applied by a spin coater, blade coater, roll coater, bar coater, or die coater, or by screen printing, followed by drying. The photoresist is exposed through a photomask with a predetermined pattern and then developed to form a photoresist layer in sections in which the plating film is not required. Subsequently, after the catalyst is activated, the flexible film is dipped in an electroless plating solution composed of copper sulfate and formaldehyde to form a copper-plating layer having a thickness of 2 to 20 µm. Next, the photoresist layer is removed away as required, thereby forming a circuit pattern.

The semi-additive process is a process as described below. An underlayer is deposited by sputtering of chromium, nickel, copper, or an alloy thereof on a surface on which a metal layer is to be formed. The thickness of the underlayer is in the range of 1 to 1,000 nm. For ensuring sufficient conduction for subsequent electrolytic plating, improving adhesion of the metal layer, and preventing pinhole defects, it is effective to further deposit a copper film having a thickness of 50 to 3,000 nm on the underlayer by sputtering. Before the underlayer is formed, in order to improve the adhesion, the surface of the flexible film may be appropriately subjected to plasma treatment, reverse sputtering, primer layer application, or application of adhesive. Among those mentioned above, the application of adhesive such as an epoxy, acrylic, polyamide, polyimide, or NBR adhesive is preferable since the effect of improving the adhesion is significant. The treatment and the application described above may be performed before or after the flexible film is adhered to the reinforcing plate. Next, a photoresist is applied to the underlayer, followed by drying. The photoresist is exposed through a photomask with a predetermined pattern and then developed to form a photoresist layer in the sections in which the plating film is not required. Electroplating is then performed by using the underlayer as an electrode. As the electroplating solution, for example, a copper sulfate plating solution, copper cyanide plating solution, copper pyrophosphate plating solution, or the like may be used. A copper-plating layer having a thickness of 2 to 20 µm is formed, and plating with gold, nickel, tin, or the like may further be performed whenever necessary. The photoresist is then removed away, and subsequently, the underlayer is removed by slight etching, thereby forming a circuit pattern.

The subtractive process is a process as described below. First, a uniform metal layer is formed on the flexible film. In order to form a uniform metal layer, a metal foil, such as a copper foil, may be adhered to the flexible film with an adhesive layer, or a metal layer may be formed on the flexible film by sputtering, plating, or combination thereof. Alternatively, a raw material resin or its precursor for the flexible film may be applied to a metal foil, such as a copper foil, followed by drying and curing, so that a flexible film provided with a metal layer is formed and is to be used for the purpose described above. Next, a photoresist is applied onto the metal layer, followed by drying. The photoresist is exposed through a photomask with a predetermined pattern and then developed to form a resist layer in the sections in which the metal film is required. After the metal layer is removed by etching, the photoresist layer is removed away, thereby forming a circuit pattern.

In the example described above, after a circuit pattern is formed on one surface of the flexible film which is not fixed, the flexible film is adhered to the glass substrate, and another circuit pattern is formed on the other surface of the flexible film. However, in the case in which very fine circuit patterns are formed on both surfaces of the flexible film, when the circuit pattern is first formed on the surface, the flexible film is preferably adhered to the glass substrate beforehand. In this case, the surface to be processed later is first adhered to the glass substrate, and a circuit pattern is formed by a subtractive process, semi-additive process, or full additive process. The surface provided with the circuit thus formed is then adhered to a different glass substrate, and the first reinforcing plate is then peeled away. A circuit pattern is then formed on the other surface by a subtractive process, semi-additive process, or full additive process. Subsequently, the flexible film provided with the circuit patterns is peeled away from the glass substrate.

In the present invention, after the circuit pattern is formed on the surface of the flexible film opposite to that adhered to the reinforcing plate as described above, the flexible film may be peeled away therefrom, or after electronic components are further bonded to the circuit pattern, the flexible film may be peeled away from the reinforcing plate. When the flexible film is peeled away from the reinforcing plate after the electronic components are bonded to the circuit pattern, it is preferable since the dimensional accuracy of the circuit pattern is highly maintained, and the alignment accuracy with the electronic components can be improved.

In a method for bonding the electronic components, such as ICs, to the circuit board, in particular, in a method for simultaneously bonding many connection portions to each other, it is important to ensure the dimensional accuracy. As the bonding methods, for example, there may be mentioned a method in which a metal layer composed of tin, gold, solder, or the like formed on connection portions of a circuit board is metal-bonded to a metal layer composed of gold, solder, or the like formed on connection portions of electronic components by thermal pressure bonding; and a method in which, while a metal layer composed of tin, gold, solder, or the like formed on connection portions of a circuit board is pressed onto a metal layer composed of gold, solder, or the like formed on connection portions of electronic components, an anisotropic conductive adhesive or nonconductive adhesive placed between the circuit board and the electronic components is cured so as to achieve mechanical bonding.

The function of the peeling-assist layer of the present invention is considered as follows. That is, compared to the flexible film, a metal layer (such as copper layer) forming a circuit pattern is liable to be plastic-deformed. In peeling the flexible film away from the reinforcing plate, when the metal layer is plastic-deformed caused by deformation such as a strain, elongation or shrinkage at a point exceeding the yield point, the flexible film provided with a circuit pattern may be bent or deformed after peeling, and in addition, the change in dimension may occur. When the peeling-assist layer is formed on the flexible film provide with a circuit pattern, the rigidity is increased (toughness to bending is increased) in cooperation with the flexible film provided with a circuit pattern. In addition, when the peeling-assist layer is provided on the circuit pattern, the bending center in the thickness direction in peeling is closer to the circuit pattern, and as a result, deformation of the metal layer can be reduced.

In the present invention, when the peeling-assist layer formed on the flexible film provided with a circuit pattern has a toughness to prevent bending or deformation of the flexible film when it is peeled away from the reinforcing plate and can be removed after the flexible film is peeled away, the material, flatness, thickness, and the like of the peeling-assist layer are not particularly limited. However, when the hardness is too high such as that of a metal or glass, the productivity is degraded due to excessively high peeling force, and in addition, plastic deformation or breakage may occur in some cases; hence, organic elastic materials such as a plastic and a rubber are preferably used.

In particular, for example, vinyl resins such as poly(vinyl alcohol), vinyl acetate, polyethylene, and polystyrene; epoxy resins, acrylic resins, polyurethane, and polyimide may be mentioned. Among those mentioned above, the vinyl resins are advantageous since they are inexpensive, are easily formed into films, are easily removed with water after the flexible film is peeled away from the reinforcing plate, and are recycled in the form of a solution which is obtained by the removal described above. In addition, the epoxy resins, polyimide resins, and the like having heat resistance and resistance to chemicals are also preferable since they have high insulating reliability, can also be used as a solder resist, and thereby can omit a step of removing the peeling-assist layer.

The peeling-assist layer which can also be used as a solder resist may be either a photosensitive or a non-photosensitive material.

As a method for forming the peeling-assist layer, for example, there may be mentioned a method in which a resin solution is applied onto the flexible film provided with a circuit pattern and adhered to the reinforcing plate, followed by drying, and a method in which a resin precursor is applied onto the flexible film, followed by curing. Although particular application methods will be described below, the temperatures for drying and firing are to be appropriately determined so as not to change the quality of the flexible film.

As the methods for coating the peeling-assist layer, for example, a spin coater, a roll coater, a die coater, screen printing, dip coater, and a spray coater may be mentioned. Application of the peeling-assist layer may be performed before or after electronic components are mounted onto the flexible film provided with a circuit pattern; however, after electronic components are mounted, the surface to be applied is not flat, and hence it is difficult to perform application using a spin coater, a contact type roll coater, or screen printing. Hence, a die coater, a dip coater, or a spray coater is preferable.

As other methods for forming the peeling-assist layer, for example, there may be mentioned a method in which a sheet-shaped resin is bonded to the surface of the flexible film provided having a circuit pattern with a removal acrylic- or urethane-based pressure-sensitive adhesive layer or the like interposed therebetween, and a method in which a sheet-shaped resin having tackiness is bonded to the surface of the flexible film provided with a circuit pattern. In the case described above, in addition to the above resins, various plastics, rubber, and the like may be used.

Furthermore, as other preferable embodiments, openings or a pattern may be provided in the peeling-assist layer in conformity with the circuit pattern or two types of layers may be partly provided. For example, after a first peeling-assist layer is provided for the flexible film provided with a circuit pattern, and openings are formed in the first peeling-assist layer at which electronic components are to be mounted, the electronic components are mounted, and subsequently, a second peeling-assist layer may be provided thereon.

Removal of the peeling-assist layer after the flexible film is peeled away from the reinforcing plate may be performed, for example, by a method in which the peeling-assist layer is dissolved in water or an organic solvent, or a method in which the peeling-assist layer is peeled away from the flexible film. However, when the peeling-assist layer is peeled away from the flexible film, in order to prevent the flexible film from being bent or deformed, the flexible film is preferably fixed to a flat vacuum-suction stage or the like.

Examples of a method for forming a circuit board of the present invention and an apparatus thereof will be described with reference to figures. An object of the forming method of the present invention and the apparatus therefor is that the flexible film provided with a circuit pattern is peeled away from the reinforcing plate without being damaged and without degrading the dimensional accuracy of the flexible film.

As one embodiment of the present invention, a method for peeling the flexible film will be described, in which when the reinforcing plate and the flexible film to be formed into a circuit board are peeled away from each other, the flexible film is peeled while being placed along a curved support body.

Figure 2A:
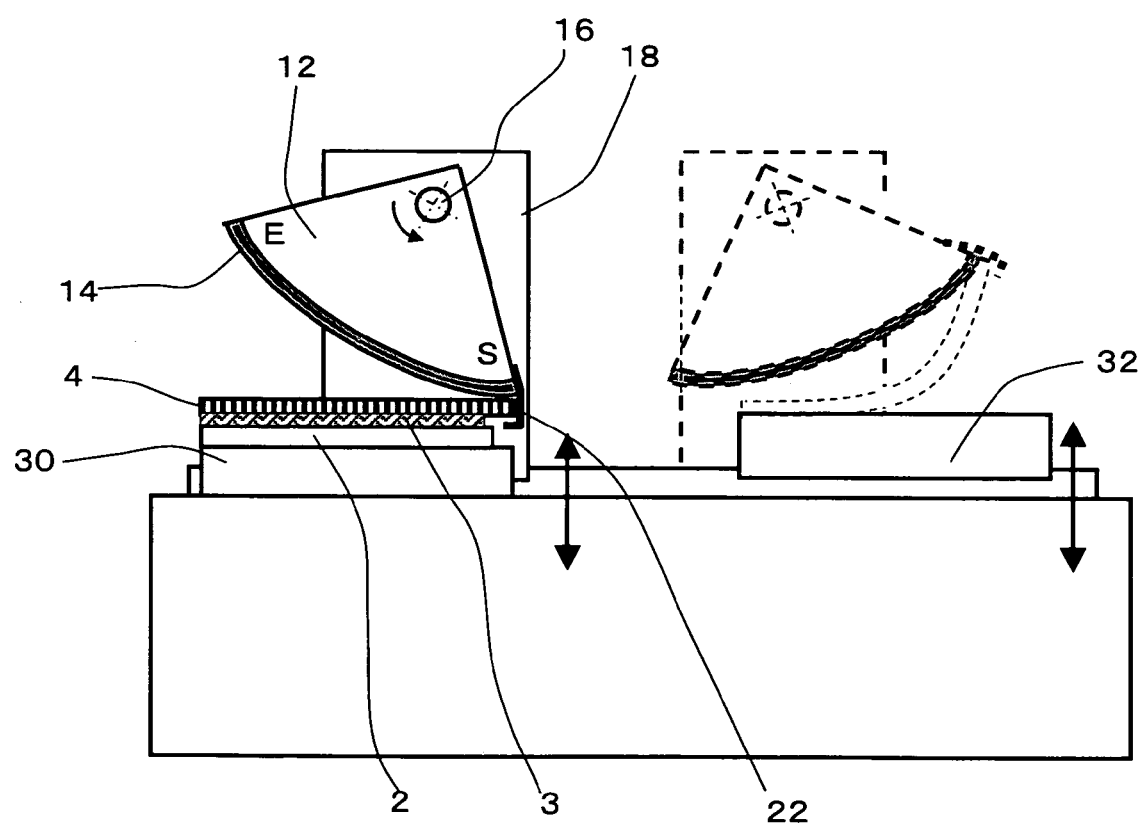
FIGS. 2(a) and 2(b) are schematic front views showing another embodiment of a peeling apparatus according to the present invention.
Figure 2B:
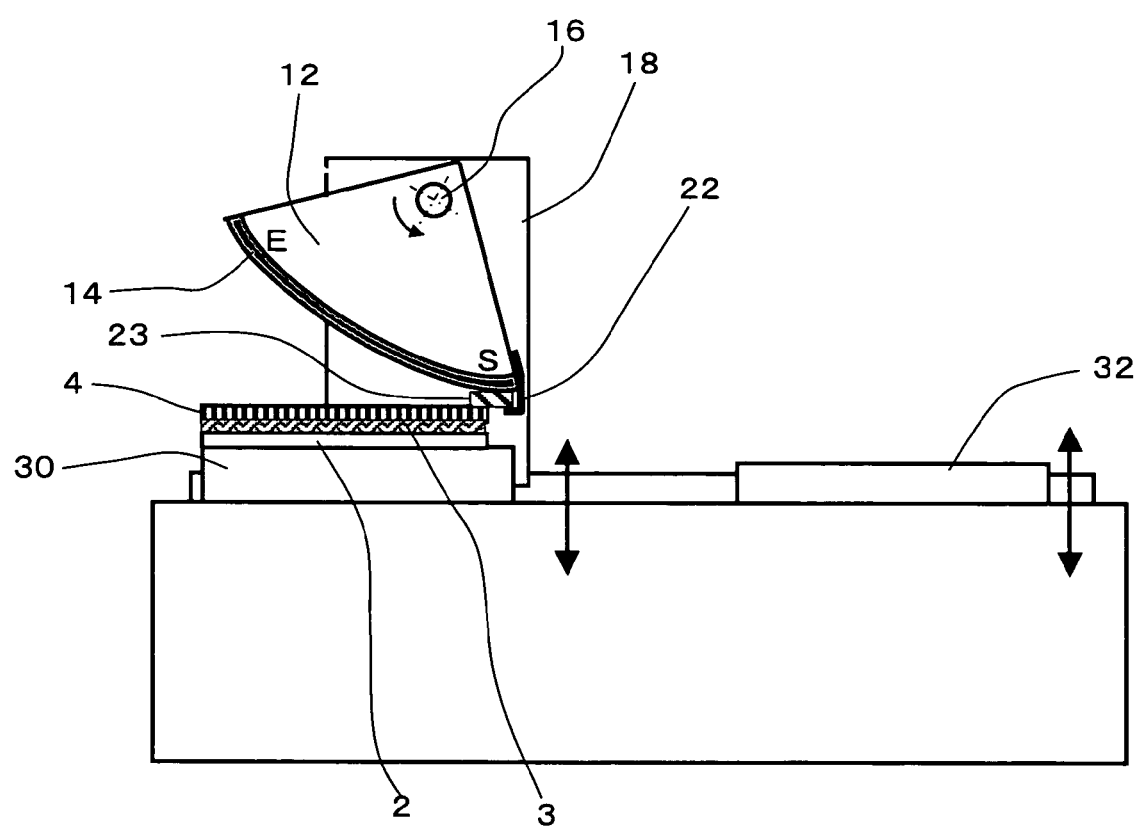
Figure 9:
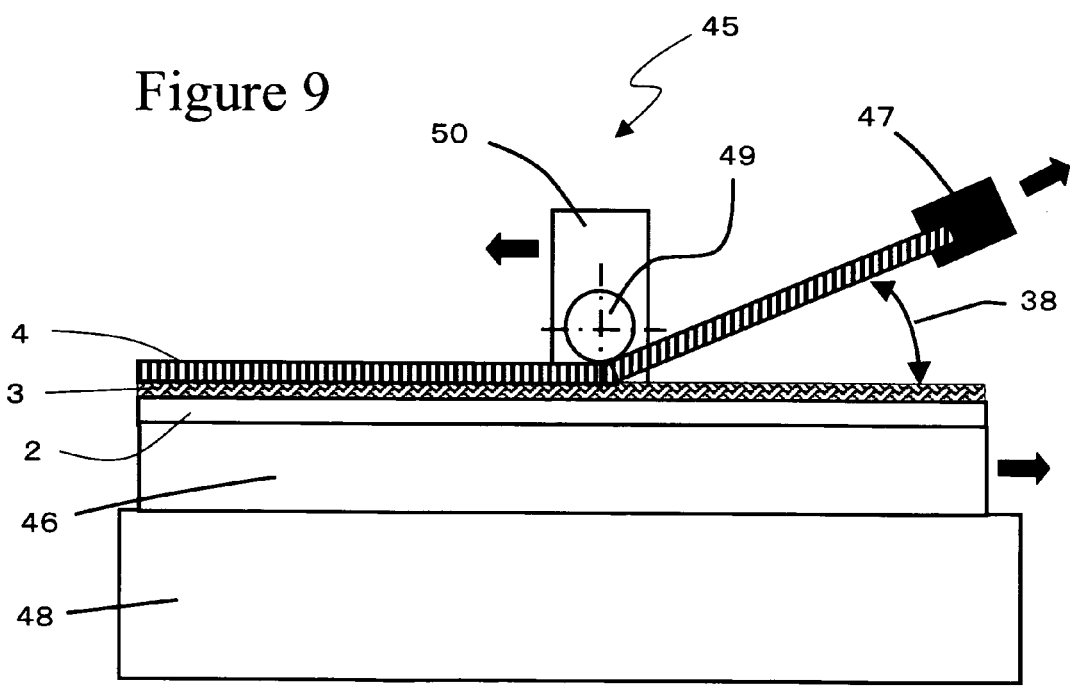
FIG. 9 is a schematic front view showing another embodiment of a peeling unit according to the present invention.
Figure 10:
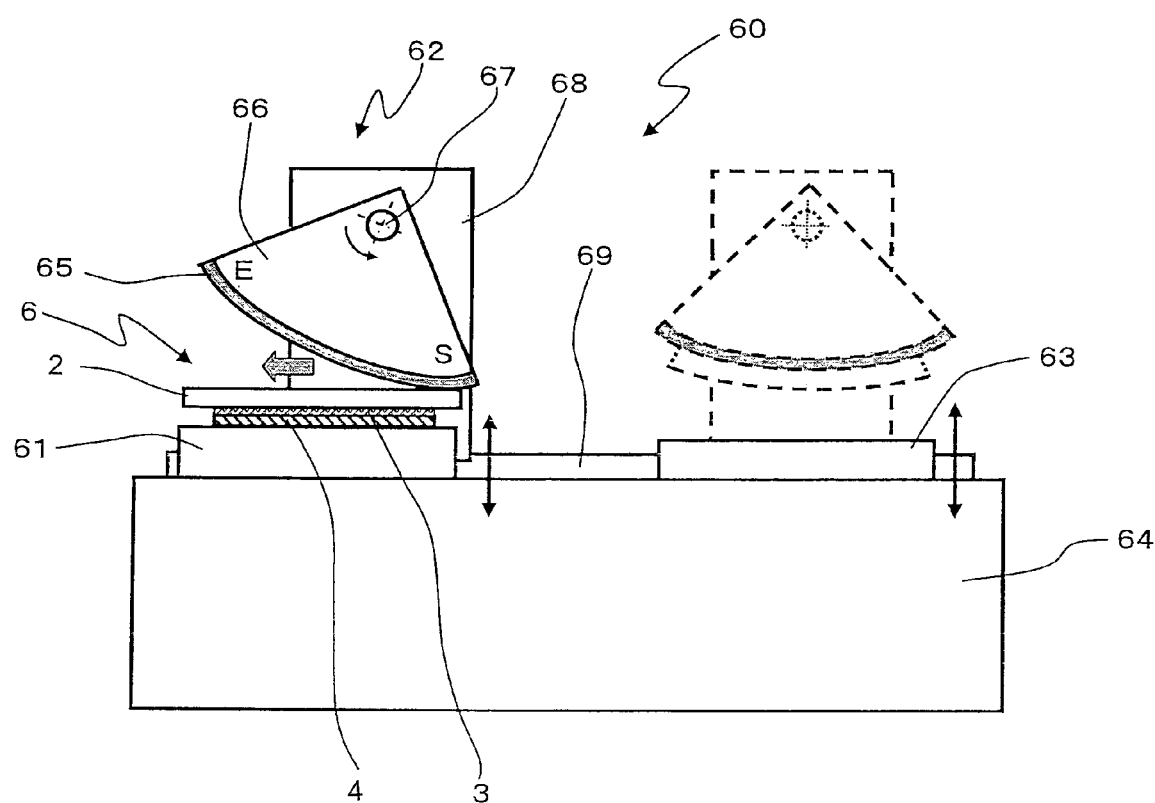
FIG. 10 is a schematic front view showing another embodiment of a peeling apparatus according to the present invention.
Figure 11:
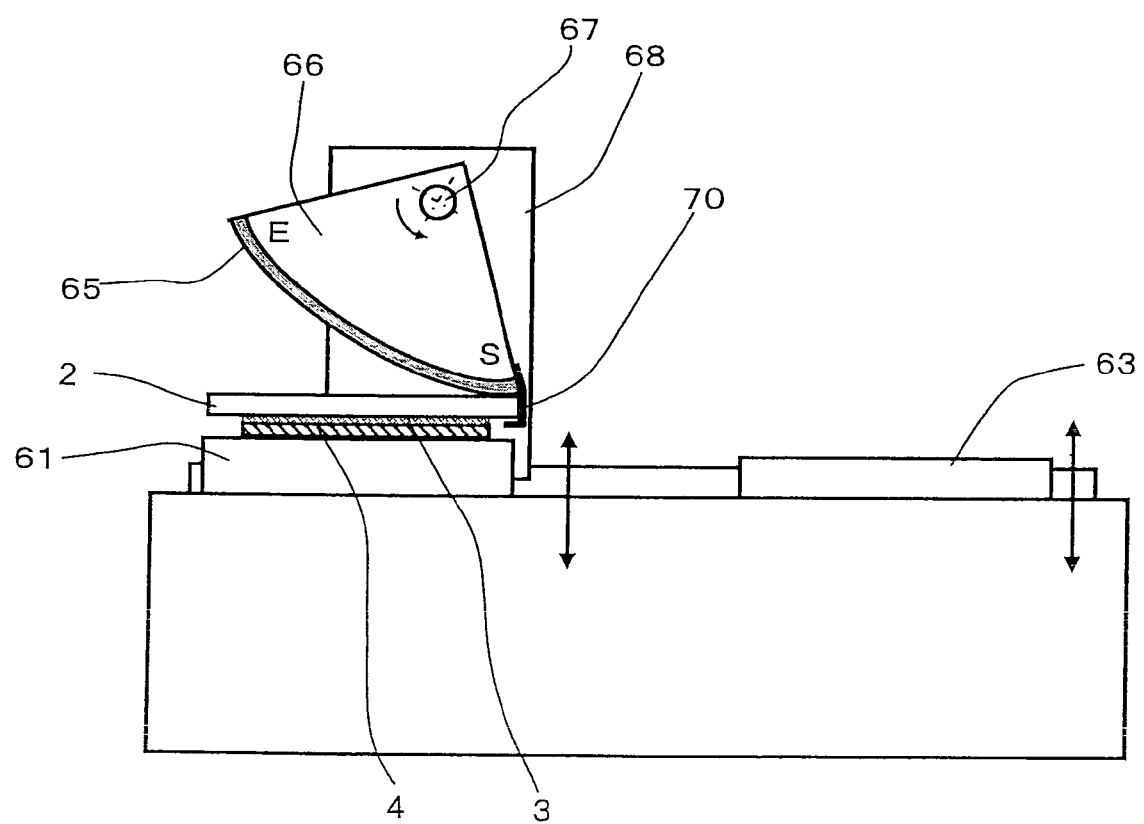
FIG. 11 is a schematic front view showing another embodiment of a peeling apparatus according to the present invention.

FIG. 1 is a schematic front view showing a peeling apparatus 1 of the present invention, FIGS. 2, 10, and 11 are schematic front views showing other embodiments using the peeling apparatus 1, and FIGS. 3 to 7 are schematic front views showing other embodiments of a support body 12 which is one element of the peeling apparatus 1. In addition, FIG. 9 is a schematic front view of a peeling unit 45 which is another embodiment of a peeling unit 10 used for the peeling apparatus 1. Furthermore, FIG. 16(*a*) is a schematic front view of a peeling apparatus 150 of the present invention for illustrating a particular example of means for monitoring a roll surface speed of a flexible-film support surface of the support body 12, a relative moving speed thereof with respect to a reinforcing plate 2, and a tension applied to the flexible film so as to set the upper limit, and FIG. 16(*b*) is a side view of the peeling apparatus 150.

First, the peeling apparatus 1 shown in FIG. 1 will be described. The peeling apparatus 1 shown in FIG. 1 primarily has the following structure. The peeling apparatus 1 is formed of a loading table 30 holding a flexible film substrate 6 having a reinforcing plate 2, which is a glass substrate, and a flexible film 4 adhered thereto with a removable organic layer 3 interposed therebetween; a peeling unit 10 actually peeling the flexible film 4 from the reinforcing plate 2; and a loading table 32 receiving the flexible film 4 which is peeled away.

The loading tables 30 and 32 are individually fitted to a base table 34 so as to be freely movable up and down and to be moved independently of each other by drive sources not shown in the figure. In addition, in the upper surface of the loading table 30 and that of the loading table 32, suction holes are provided so that workpieces placed on the individual tables are to be independently held by vacuum-suction using vacuum sources not shown in the figure.

Next, the peeling unit 10 is composed of the support body 12 having a holding portion 14 at the surface thereof which is to be in contact with the flexible film 4, a frame 18 cantilevering the support body 12 with a shaft 16 so that support body 12 is freely rotatable thereabout, and a rail 20 freely guiding the frame 18 along the base table 34. Suction holes are provided in the surface of the holding portion 14. By a vacuum source not shown in the figure, the suction holes can perform vacuum-suction of parts of the flexible film 4 which come into contact with the surface of the holding portion 14. The suction holes provided in the holding portion 14 are formed so that the parts of the flexible film 4 which come into contact with the holding portion 14 are sequentially vacuum-sucked. In addition, in order to hold the flexible film 4 while it is being curved, the contact surface of the holding portion 14 is a curved surface. In addition, by an air-supply source not shown in the figure, when a gas is supplied to the suction holes provided in the surface of the holding portion 14, the flexible film 4 held by the holding portion 14 can be separated therefrom.

A material for the holding portion 14 is not particularly limited; however, a plastic or an elastomer, such as a rubber or a foamed plastic, having cushioning properties is preferably used. Accordingly, various effects may be obtained thereby; for example, the flexible film may be prevented from being damaged, recess portions to receive electronic components, which will be described later, may be easily formed, and bending of the flexible film caused by edges of the recess portions may become unlikely to occur. In addition, when the holding portion 14 further has tackiness such as that of a silicone resin, since the increase in slip length between the holding portion 14 and the flexible film 4 can be suppressed, the increase in slip length being caused by accumulation of elongation of the flexible film which occurs as the peeling thereof progresses, the increase in peel angle concomitant with the progress of peeling can be preferably reduced. As an index of the tackiness, when the flexible film 4 is peeled away from the holding portion 14, the peel strength in the direction at an angle of 180° is preferably 9.8 N/m or less.

The holding portion 14 has a curvature radius designed in consideration of the peeling performance and the amount of deformation acceptable for the flexible film 4 provided with a circuit pattern; however, different curvature radius may also be partly formed. The lower limit of the curvature radius of part of the holding portion 14 which is at least brought into contact with the flexible film 4 is preferably 20 mm or more, more preferably 30 mm or more, and even more preferably 50 mm or more. In addition, the upper limit of the curvature radius of the part of the holding portion 14 which is at least brought into contact with the flexible film 4 is preferably 1,000 mm or less, more preferably 800 mm or less, and even more preferably 700 mm or less. When the curvature radius is too small, the flexible film or the metal layer forming the circuit pattern is plastic-deformed, and hence the generation of curling may be caused thereby. When the curvature radius is too large, compared to a force peeling the flexible film from the reinforcing plate, since a force pulling the flexible film in a peel angle direction becomes large, the flexible film or the metal layer forming circuit pattern is plastic-deformed by elongation, and hence the degradation in dimensional accuracy may occur thereby.

Furthermore, the rotation of the support body 12 and the horizontal movement of the frame 18 are independently performed by drive motors not shown in the figure and are controlled so that a contact portion between the flexible film 4 and holding portion 14 is sequentially moved in the horizontal direction (direction indicated by a horizontal arrow in the figure). A roll surface speed V1 of a flexible film holding surface of the support body 12, that is, of the surface of the holding portion 14, is set to be higher than a relative moving speed V2 of the support body with respect to the reinforcing plate, and in addition, in the range in which V1 is not lower than V2, V1 is controlled by a torque limitation mechanism so that a torque applied to the support body, that is, a tension applied to the flexible film, is not more than a predetermined value. Control of V1, V2, and the torque can be performed by a mechanical system, an electronic system, or the combination thereof. As a mechanical torque control system, for example, a system, which is a so-called slip ring, may be used and is preferable since being simple and easy. As an electronic torque control system, for example, combination of a torque sensor and a servomotor may be used as described later and is preferable in terms of accuracy in control and a large degree of control freedom. As the initial set values of V1 and V2, V1/V2 is preferably set to 1.01 or more. The set value of torque limitation is to be determined so as to be enough to prevent the increase in peel angle concomitant with the progress of peeling and so as to be in the range in which the circuit pattern made of a metal and the flexible film are not plastic-deformed; hence, in consideration of the material, width, and thickness of the flexible film, the set value is optionally determined.

Figure 7:
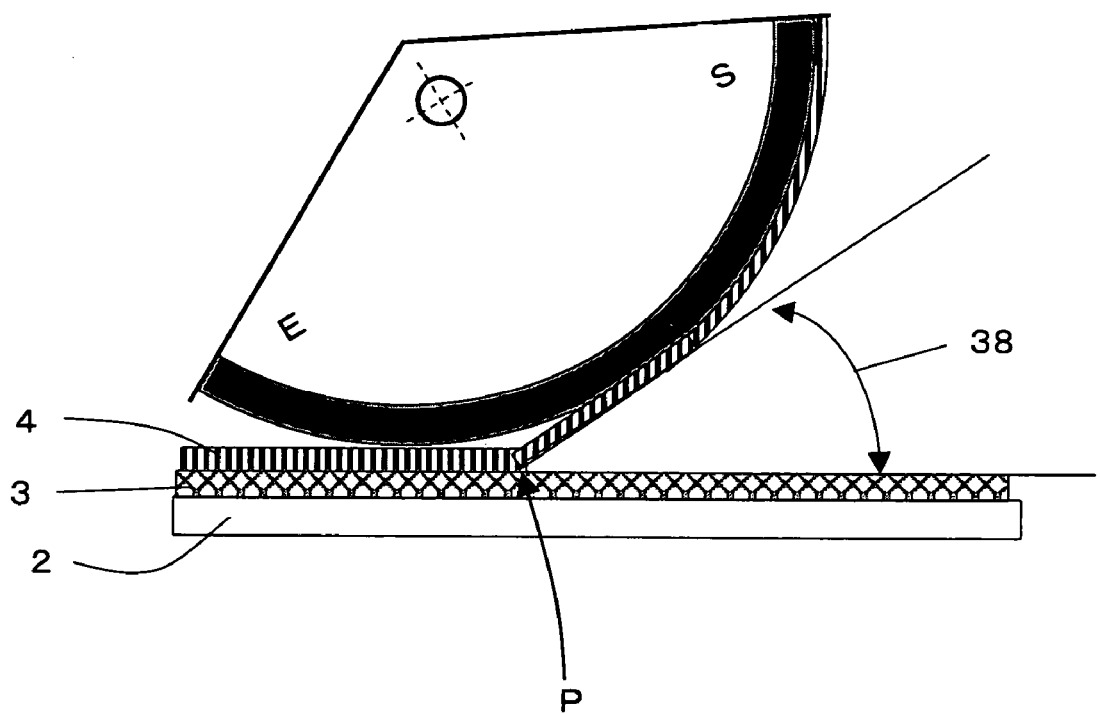
FIG. 7 is a schematic front view showing another embodiment of the support body 12.

According to one embodiment of the present invention, it is important that a peel angle 38 formed between the reinforcing plate 2 and the flexible film 4 which is being peeled as shown in FIG. 7 be in the range of more than 0° to 80°. When the peel angle is too large, bending of the flexible film may occur at a peel point in some cases, and when a circuit pattern of a metal is formed on the flexible film, bending or deformation of the circuit pattern may occur in some cases. On the other hand, when the peel angle is too small, since a force of peeling the flexible film from the reinforcing plate is increased, the flexible film and the metal layer forming a circuit pattern are plastic-deformed by elongation, and hence the degradation in dimensional accuracy may occur in some cases. Hence, the range of the peel angle for peeling the flexible film from the flexible film substrate 6 at a low stress without causing any strain is more preferably 2° to 70° and most preferably 5° to 60°.

In the present invention, the peel strength is measured as a 180°-direction peel strength which is obtained when a flexible film having a width of 1 cm adhered to a reinforcing plate with a removable organic layer interposed therebetween is peeled away therefrom. In measuring the peel strength, the peel rate is set to 300 mm/min. In the present invention, in order to control the peel angle in the most preferable range, the peel strength is preferably in the range of 0.098 to 98 N/m.

Since the loading table 30 is freely moved up and down, when the flexible film 4 is to be peeled away from the reinforcing plate 2, the loading table 30 is moved in the vertical direction and is then stopped at a position at which the flexible film 4 and the holding portion 14 is brought into contact with each other at a predetermined pressure. In addition, the loading table 32 is provided for receiving the flexible film 4 thereon which is vacuum-sucked to the holding portion 14 of the peeling unit 10. That is, after the peeling is complete, while vacuum-sucking the flexible film 4, the peeling unit 10 is moved to the loading table 32 as shown by dotted lines in FIG. 1. After the distance between the holding portion 14 and the loading table 32 is controlled preferably in the range of 0.1 to 3 mm and more preferably in the range of 0.1 to 1 mm by moving the loading table 32 in the vertical direction, the vacuum-suction is released so as to separate the flexible film 4 from the holding portion 14, and as a result, the flexible film 4 is transferred onto the loading table 32.

Next, a method for peeling the flexible film 4 using the peeling apparatus 1 shown in FIG. 1 will be described.

After the loading table 30 is moved to the lowest point, by transfer means not shown in the figure, the flexible film substrate 6 is placed on the loading table 30 so that the reinforcing plate 2 is located at the lower side (the flexible film 4 is located at the upper side). Subsequently, the vacuum source not shown in the figure is driven, so that the flexible film substrate 6 is held on the loading table 30 by vacuum-suction. Next, in order to place a start point S of the holding potion 14 of the peeling unit 10 at a position over the right end of the flexible film 4 in the figure, the frame 18 is moved, and the support body 12 is moved by rotation. After the positioning of the holding portion 14 is complete, the loading table 30 is moved upward, so that the right end of the flexible film 4 and the start point S of the holding portion 14 are brought into contact with each other at a predetermined pressure. The pressure is preferably in the range of 0.001 to 1 MPa and more preferably in the range of 0.01 to 0.2 MPa.

While the state described above is being maintained, the vacuum source not shown in the figure is driven, so that the flexible film 4 is vacuum-sucked to the holding portion 14. Subsequently, the frame 18 is moved to the left side and the support body 12 is rotated in an anticlockwise direction.

The curved surface of the holding portion 14 is sequentially brought into contact with the upper surface of the flexible film 4 from the right side (in the figure). Accordingly, sine being sequentially curved from the right side, the flexible film 4 is being separated from the reinforcing plate 2, and as a result, the peeling between the two described above is sequentially performed from the right side. When an end point E of the holding portion 14 reaches the left end of the flexible film 4, comes into contact with the left end thereof, and passes therethrough, the peeling is complete when the peeling is complete, the movement of the frame 18 and the rotation of the support body 12 are stopped, and the loading table 30 is moved downward, so that the flexible film 4 and the reinforcing plate 2 are substantially separated from each other. The mechanism described above corresponds to separation means of the present invention. Besides the mechanism described above, another mechanism will be described later in which the peel angle can be controlled to be 80° or less.

Subsequently, the support body 12 is rotated clockwise so that the central portion of the flexible film 4 vacuum-sucked to the holding portion 14 is located at the lowest position. The frame 18 is then moved in the right direction, so that the flexible film 4 held by the holding portion 14 is placed over the loading table 32. Next, the loading table 32 is moved upward so that the space between the upper surface of the loading table 32 and the lowest point of the flexible film 4, which is the central portion thereof, is 0.1 to 1 mm. After the space described above is ensured, the vacuum-suction by the holding portion 14 is released, so that the flexible film 4 is transferred onto the loading table 32. Next, by a transfer device not shown in the figure, the separated flexible film 4 and the reinforcing plate 2 on the loading table 30 are individually transferred to subsequent steps. In this case, the reinforcing plate 2 is released from the vacuum-suction and is then transferred. Subsequently, after the peeling unit 10 is returned to the original position, the same steps as described above are then repeatedly performed, so that peeling of the following flexible film substrate 6 is performed.

In a peeling apparatus shown in FIG. 2(*a*), a holding mean 22 having a hook for holding one end portion of the flexible film 4 is fixed to one end of the support body 12 of the peeling apparatus 1 shown in FIG. 1. A material for the holding mean 22 is not particularly limited, and for example, a metal, a resin, and a ceramic may be used. However, a composite structure is preferably used in which a main body is made of a metal and a contact part with the flexible film 4 is made of a soft and non-slippery material such as a rubber or a resin.

A peeling method performed using the peeling apparatus shown in FIG. 2(*a*) is as follows.

The loading table 30 is moved down to the lowest position, and the frame 18 is then moved to the right side so that the holding portion 14 is not located over the loading table 30. While the state described above is being maintained, by the transfer means not shown in the figure, the flexible film substrate 6 is placed on the loading table 30 so that the reinforcing plate 2 is located at a lower side (the flexible film 4 is located at an upper side). Subsequently, by using the vacuum source not shown in the figure, the flexible film substrate 6 is held on the loading table 30 by vacuum-suction.

Next, the loading table 30 is moved upward so that a part of the holding mean 22; which has a hook shape, is placed at a position corresponding to the right end portion of the flexible film 4. Then, the frame 18 is moved to the left side so that the right end portion of the flexible film 4 is fitted into the hook-shaped portion of the holding mean 22 as shown in FIG. 2(*a*) so that the holding mean 22 can hold the right end portion of the flexible film 4. In this case, the gap between the hook-shaped portion of the holding member 22 and the right end portion of the flexible film 4 in the thickness direction is preferably in the range of 0.1 to 5 mm and more preferably 0.5 to 1.5 mm.

In order to hold the end portion of the flexible film 4 by the holding mean 22, the end portion of the flexible film 4 may extend past the edge of the reinforcing plate 2. In addition, as shown in FIG. 2(*b*), after the flexible film substrate 6 in which a lead film 23 is adhered to the flexible film 4 by a different method is placed on the loading table 30, the end portion of the lead film 23 may be held by the holding member 22.

Subsequently, while the state described above is being maintained, the movement of the frame 18 in the left direction and the rotation of the support body 12 anticlockwise are synchronously performed, so that the curved surface of the holding portion 14 is sequentially brought into contact with the upper surface of the flexible film 4 from the right side (in the figure). Accordingly, while being curved, the flexible film 4 is sequentially lifted upward from the right end portion so as to be separated from the reinforcing plate 2 which is held by vacuum-suction, and as a result, the peeling between the two described above is sequentially performed from the right side. When the end point E of the holding portion 14 reaches the left end of the flexible film 4, comes into contact with the left end thereof, and passes therethrough, the peeling is complete. When the peeling is complete, the movement of the frame 18 and the rotation of the support body 12 are stopped, and the loading table 30 is moved downward, so that the flexible film 4 and the reinforcing plate 2 are substantially separated from each other.

Subsequently, the frame 18 is moved to the right side, and the end portion of the flexible film 4 which is not held by the holding mean 22 is positioned so as to face the end portion of the loading table 32. While the state described above is being maintained, the movement of the frame 18 in the right direction and the rotation of the support body 12 clockwise are synchronously performed, so that the flexible film 4 is being transferred onto the loading table 32.

Next, the holding by the holding mean 22 is released, and the frame 18 is further moved to the right side so that the right end portion of the flexible film 4 is disengaged from the hook-shaped portion of the holding member 22; hence, the flexible film 4 is totally transferred onto the loading table 32. When the transfer is complete, the loading table 32 is moved to the lowest position. Next, by the transfer device not shown in the figure, the separated flexible film 4 and the reinforcing plate 2 are individually transferred to subsequent steps. Subsequently, after the peeling unit 10 is returned to the original position, the same steps as described above are then repeatedly performed, so that peeling of the following flexible film substrate 6 is performed.

Figure 3:
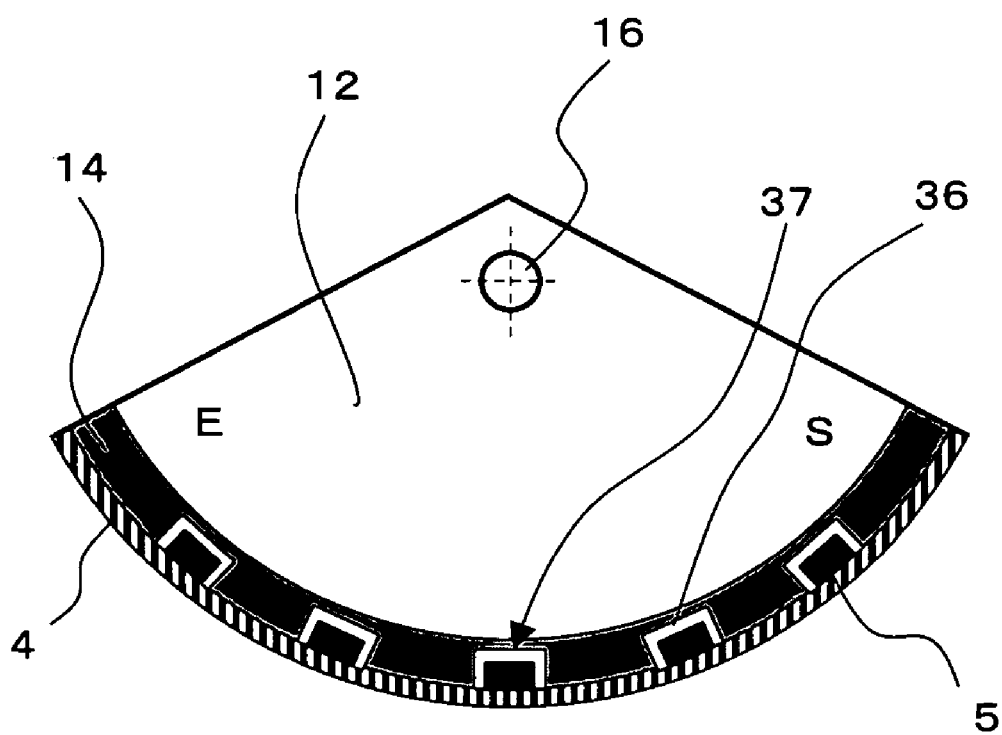
FIG. 3 is a cross-sectional view showing a groove shape formed in a support body 12.
Figure 4:
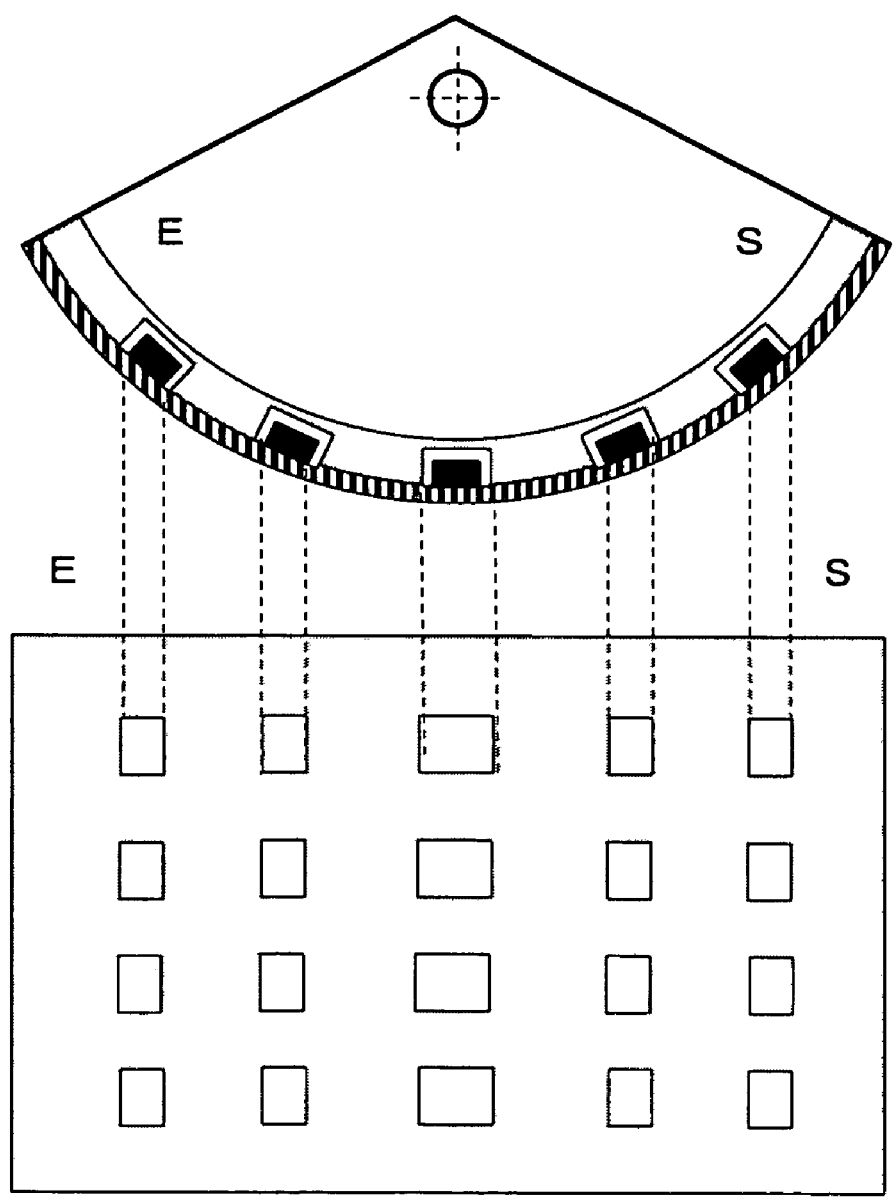
FIG. 4 is a cross-sectional view showing another groove shape formed in the support body 12.
Figure 5:
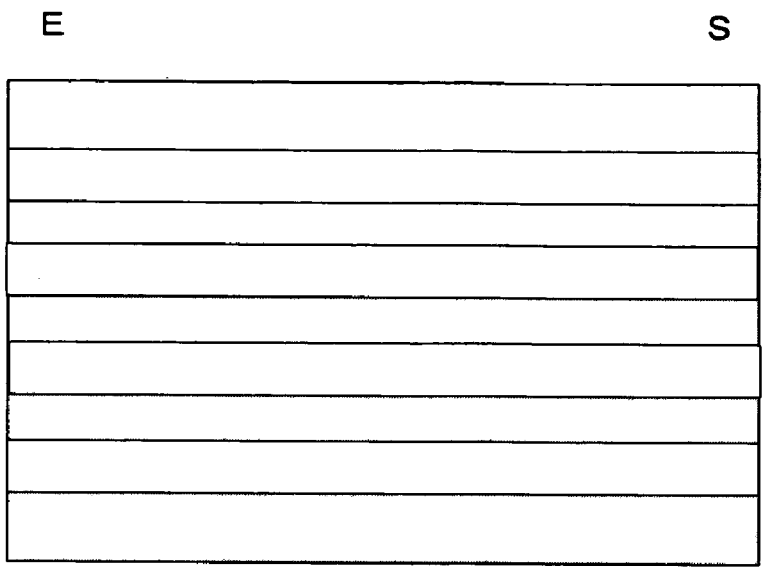
FIG. 5 is a front view showing a groove shape formed in the-support body 12.
Figure 6:
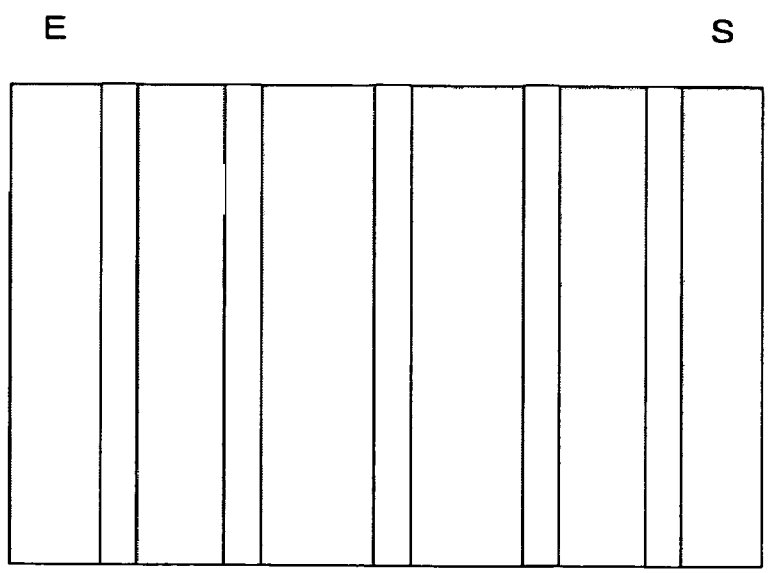
FIG. 6 is a front view showing another groove shape formed in the support body 12.

When electronic components 5 such as IC chips are mounted on the flexible film 4, recess portions 36 corresponding to the electronic components 5 are preferably provided in the holding portion 14 of the support body 12 as shown in FIG. 3 or 4. The change in size of the recess portion 36 may be performed using an adaptor. As for the size of the recess portion corresponding to an IC chip, for example, the depth is 0.5 to 2 mm and the length and the width are each 1 to 20 mm. In addition, the shape of the recess portion may be a grove in which a plurality of IC chips is placed, and the direction of the groove may be parallel to the direction of peeling of the flexible film as shown in FIG. 5 or may be perpendicular thereto as shown in FIG. 6. Furthermore, a suction hole may be provided in a bottom surface 37 of the recess portion 36 so that the electronic component 5 is brought into contact with the bottom surface 37 and is then hold to the holding portion 14 by vacuum-suction. In addition, the holding portion 14 may be formed of a flexible material having micropores which can perform vacuum-suction so that the electronic components 5 are buried in this raw material and are hold by vacuum-suction.

In the case in which a circuit pattern made of a metal is provided on the flexible film 4, according to the present invention, the deformation of the circuit pattern, the generation of warping of the flexible film 4, and the degradation in dimensional accuracy of the circuit pattern are prevented. Furthermore, when electronic components such as IC chips are further mounted on a circuit board composed of a flexible film, concomitant with the increase in force for peeling parts on which the electronic components are mounted, a force is concentrated to the edge of the electronic components, and as a result, the circuit board may be deformed in some cases; however, according to the present invention, the reliability against the deformation, warping, and dimensional accuracy can be advantageously obtained. In addition, when resin molding is performed for electronic components such as IC chips, a stress applied to the edge of the electronic components in peeling is reduced, and as a result, the reliability of the circuit board is preferably improved.

A method for holding the flexible film substrate 6 by the loading table 30 is not particularly limited, and besides the vacuum-suction described in the above embodiment, electrostatic suction may also be used. For performing electrostatic suction, it is preferable that the loading table 30 be conductive, and a ground potential or an optional voltage be applied in accordance with a method for applying static electricity. In addition, in order to decrease the peeling force of the removable organic layer 3, a heating device is preferably provided in or on the loading table 30. For the same purpose as described above, a heating device is preferably provided for the support body 12 or the holding portion 14. In order to sufficiently decrease the peeling force, the heating temperature is preferably high; however, when the heating temperature is excessively high, the quality of the organic layer may be changed, and as a result, it becomes difficult to remove an organic layer remaining on the flexible film 4 after the peeling. Hence, the heating temperature for the removable organic layer 3 is preferably in the range of 30 to 280° C.

Next, the peeling apparatus 150 of the embodiment according to the present invention will be described with reference to FIGS. 16(*a*) and 16(*b*). In the peeling apparatus 150, instead of a slip ring, electrical control means is added to the peeling unit 10 of the peeling apparatus 1, so that a peeling unit 170 is formed, the electrical control means being used for monitoring the roll surface speed of the flexible film-support surface of the support body 12, the relative moving speed of the support body 12 with respect to the reinforcing plate 2, and the tension applied to the flexible film for setting the upper limit thereof. In more particular, the peeling apparatus 150 is formed by adding the following elements to the peeling apparatus 1, and the elements are a linear scale 152 measuring the relative moving speed V2 of the frame 18 with respect to the loading table 30 (fixed), an encoder 154 measuring the rotational angular speed of the support body 12, and an electromagnetic clutch 156 controlling torque applied to the support body 12. When the length from the center of the shaft 16 to the holding surface of the holding portion 14 which is in contact with the flexible film 4 of the flexible film substrate 6 is represented by R, when this R is multiplied by the rotational angular speed measured by the encoder 154, the roll surface speed V1 of the holding surface of the holding portion 14 can be calculated. In this embodiment, the holding surface of the holding portion 14 is identical to the flexible film-support surface of the support body 12. Furthermore, a control device 162 is also added to the peeling apparatus 1, and hence the peeling apparatus 150 is formed. In accordance with speed information including the roll surface speed V1 of the holding surface of the holding portion 14 obtained by measurement by the encoder 154 and the relative moving speed V2 of the frame 18 measured by the linear scale 152, the control device 162 controls the speed of the a rotary motor 160 rotationally driving the support body 12 about the shaft 16 through the electromagnetic clutch 156 and the speed of a linear motor 158 driving the frame 18. The control device 162 also has a function of controlling the driving torque of the support body 12 by changing a supply voltage to the electromagnetic clutch 156. In this structure described above, the rotary motor 160 and the electromagnetic clutch 156 are provided for the frame 18 with a support bracket 164.

In addition, when the frame 18 is moved at the relative moving speed V2, the support body 12 provided therefor is also moved at the same relative moving speed V2.

In the peeling apparatus 150, when the flexible film 4 of the flexible film substrate 6 is peeled away from the reinforcing plate 2, the peel angle 38 shown in FIG. 7 can be controlled. That is, when the roll surface speed V1 of the holding surface of the holding portion 14 is set lower than the relative moving speed V2 of the frame 18, the flexible film 4 starts to be loosened, and then, a peeling point P shown in FIG. 7 is varied, thereby causing very unstable peeling. In this case, since the peeling point is moved to the right side as a ratio V1/V2 is decreased, while unstable behavior is being shown, the peel angle 38 is increased. On the other hand, when the roll surface speed V1 of the holding surface of the holding portion 14 is set higher than the relative moving speed V2 of the frame 18, a tension is applied from the support body 12 to the flexible film 4. In the state in which V1/V2>1 holds, when V1/V2 is increased, a tension applied to the flexible film 4 is increased, and in addition, since the peeling point P is moved to the left side, the peel angle 38 is gradually decreased. In addition, since the flexible film 4 is not loosened, the position of the peeling point P is stabilized, and as a result, the peeling is also stabilized. Hence, under a condition of V1/V2>1 at which the peeling can be stabilized, when the ratio V1/V2 is adjusted, the peel angle 38 can be set to a desired value.

However, when the ratio V1/V2 is excessively increased, the tension applied to the flexible film 4 becomes excessively large, and as a result, various problems may arise. For example, the flexible film 4 is largely deformed, the dimensions and shapes of a precise circuit pattern on the flexible film 4 are changed, and in a very serious case, the circuit pattern is disadvantageously damaged and rejected as a defect.

In order to solve the problems described above, the tension applied to the flexible film 4 in peeling is preferably limited to be a certain level or less at which the problems may not arise. In the peeling apparatus 150, by adjusting the supply voltage to the electromagnetic clutch 156, torque control can be performed so that the torque applied to the support body 12 becomes a predetermined level or less. Since the flexible film 4 is held by the holding portion 14 of the support body 12, the torque applied to the support body 12 is converted into a tension applied to the flexible film 4. Hence, when the torque applied to the support body 12 is limited, the tension applied to the flexible film 4 can be limited. However, in this case, when the torque reaches a limit value, the rotation of the shaft 16 of the support body 12 is in a slipping state with respect to the rotation of the rotary motor 160, and although the rotary motor 160 is driven so as to keep the roll surface speed V1 of the holding surface of the holding portion 14 at a predetermined value, the actual, roll surface speed V1 of the holding surface of the holding portion 14 is low as compared to that obtained when the electromagnetic clutch 156 is not in a slipping state. Hence, the actual roll surface speed V1 of the holding surface of the holding portion 14 is dependently determined by the torque limit value. Also in this case, the torque limit value is preferably selected so that V1/V2>1 holds and so that the peel angle 38 is in a desired range.

As described above, in the peeling apparatus 150, the roll surface speed V1 of the holding surface of the holding portion 14 and the relative moving speed V2 are adjusted so that V1/V2 is more than 1 for stabilizing the peeling. In addition, in the peeling apparatus 150, by adjusting the torque applied to the support body 12, the tension applied to the flexible film 4 can be limited, and hence the peeling can be stably performed without deforming the flexible film 4 and also without damaging the circuit pattern provided on the flexible film 4.

In the peeling apparatus 150, the setting of the ratio V1/V2>1, and the control of limiting the tension applied to the flexible film is performed by the torque control by a control device 162 using the above electromagnetic clutch 156. In addition to that described above, the speed control of the roll surface speed V1 of the holding surface of the holding portion 14 and the speed control of the relative moving speed V2 can also be performed. In the speed control described above, the limit torque is first increased by increasing the supply voltage to the electromagnetic clutch 156 so that the rotation of the support body 12 is not placed in a slipping state with respect to the rotation of the rotary motor 160, and that the rotation speed of the rotary motor 160 and the relative moving speed V2 of the frame 18 by the linear motor 158 are controlled so that the ratio V1/V2 has an appropriate value of more than 1. Since the tension applied to the flexible film 4 is increased as the ratio V1/V2 is increased, the ratio V1/V2 is set so that the tension has a limited value.

Either the speed control or the torque control may be used; however, in the case of the torque control, the looseness caused by accumulated elongation of the flexible film 4 while the peeling is being performed for a long period of time and the increase in peel angle 38 caused thereby can be prevented, and the flexible film provided with a circuit pattern can always be peeled away advantageously at a low stress.

Instead of the torque control using the electromagnetic clutch 156, there may also be used another mechanical torque control system such as a slip ring or an electronic torque control system realized by combination of a torque sensor and a servomotor. In addition, the combination of the mechanical and electronic torque control systems can also be used. The ratio V1/V2 of the roll surface speed V1 of the holding surface of the holding portion 14 to the relative moving speed V2 of the frame 18 is preferably set to 1.01 or more. The limit value of the torque applied to the support body 12 and that of the tension applied to the flexible film 4 must be set in the range so that the increase in peel angle concomitant with the progress of peeling is satisfactorily prevented and so that the circuit pattern made of a metal and the flexible film are not plastic-deformed, and hence the limit values are optionally selected in consideration of the material, the width, and the thickness of the flexible film. The tension per unit area applied to the flexible film 4 is $2.4 \times 10^7$ N/m$^2$ or less, more preferably $1.2 \times 10^7$ N/m$^2$ or less, and most preferably $8 \times 10^6$ N/m$^2$ or less.

A method for peeling the flexible film 4 using the peeling apparatus 150 is performed in the same manner as that in the method for peeling the flexible film 4 by the peeling apparatus 1 except that by using the control device 162, 1) V1/V2 is set to an appropriate value of 1 or more so that the peel angle 38 has a desired value, 2) speed control of the motor 160 is performed so that the roll surface speed V1 of the holding surface of the holding portion 14 has a predetermined value, 3) speed control is performed by driving the linear motor 158 so that the relative moving speed V2 of the frame 18 has a predetermined value, and 4) the torque applied to the support body 12 is limited by adjusting the supply voltage to the electromagnetic clutch 156 so that the tension applied to the flexible film 4 in peeling is limited.

Figure 8:
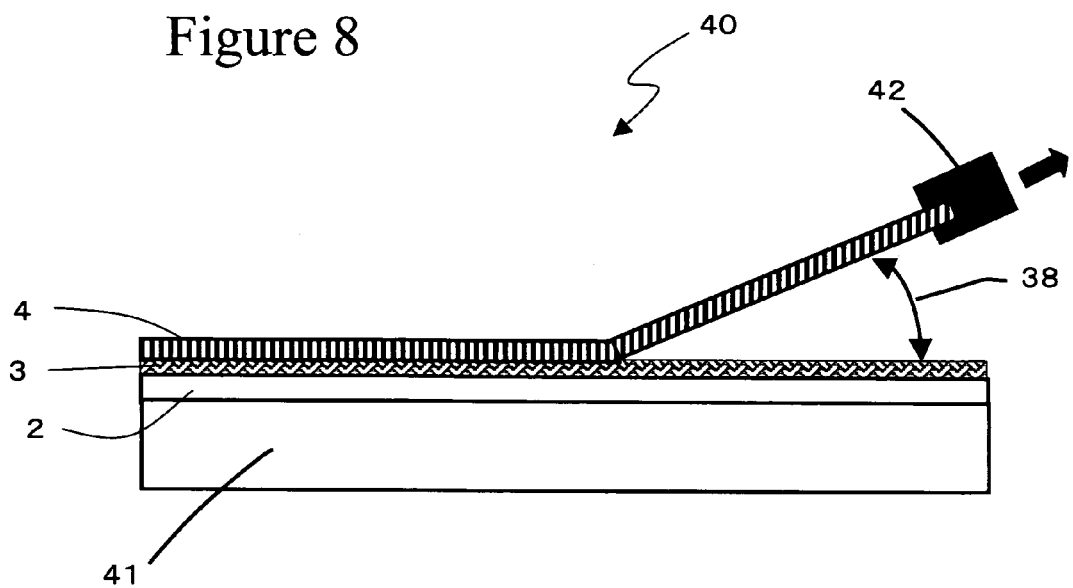
FIG. 8 is a schematic front view showing another embodiment of a peeling unit according to the present invention.

In the peeling apparatus 1, the peeling unit 10 may be replaced with a peeling unit 40 shown in FIG. 8 or a peeling unit 45 shown in FIG. 9. The peeling unit 40 is composed of a loading table 41 and a peeling mean 42, the loading table 41 being provided for holding the reinforcing plate 2 of the flexible film substrate 6 composed of the reinforcing plate 2 and the flexible film 4 adhered thereto with the removable organic layer 3 interposed therebetween, the peeling mean 42 being provided for holding the flexible film 4 and pulling it in the direction extending along the peel angle 38 indicated by an arrow so as to peel away the flexible film 4 from the removable organic layer 3.

The peeling mean 42 can hold the end of the flexible film 4 and pull it while the peel angle 38 is stably maintained in the range of more than 0 to 80° by a drive source not shown in the figure; however, in order to more stably control the peel angle 38, the peeling unit 45 described below is preferably used.

As shown in FIG. 9, the peeling unit 45 is composed of a loading table 46, a peeling mean 47, and a support roller 49, the loading table 46 being provided for holding the reinforcing plate 2 of the flexible film substrate 6 composed of the reinforcing plate 2 and the flexible film 4 adhered thereto with the removable organic layer 3 interposed therebetween, the peeling mean 47 being provided for holding the flexible film 4 and pulling it in the direction extending along the peel angle 38 indicated by an arrow so as to peel away the flexible film 4 from the removable organic layer 3, the support roller 49 being provided on a frame 50 for supporting the flexible film 4 in peeling.

The loading table 46 and the frame 50 are fitted to the base table of the peeling apparatus 1 and can be moved independently of each other in the horizontal direction by drive sources and guides which are not shown in the figure. The support roller 49 may be rotated by a drive source not shown in the figure, may be used as a free roller when being separated from the drive source, or may be fixed so as not to be rotated.

When the peeling mean 47 holds the end portion of the flexible film 4 by a drive source not shown in the figure and pulls it in the direction extending along the peel angle 38 indicated by the arrow in synchronous with the movement of the loading table 46, the peeling can be performed while the peel angle 38 is maintained in the range of more than 0° to 80°. When the peeling is performed, the frame 50 provided with the support roller 49 may be stopped or may be moved in the direction indicated by an arrow, that is, the direction opposite to that of the movement of the loading table 46.

Alternatively, as another embodiment, when the peeling mean 47 holds the end portion of the flexible film 4 by the drive source not shown in the figure and pulls it in synchronous with the movement of the frame 50 in the direction indicated by the arrow, that is, in the direction to the left side in FIG. 9, the peeling can be performed while the peel angle 38 is maintained in the range of more than 0° to 80°. When the peeling is performed, the loading table 46 may be stopped or may be moved in the direction opposite to that of the movement of the frame 50.

When the peeling is performed using the peeling unit 45, it is preferable that the flexible film 4 be supported by the surface of the support roller 49. Accordingly, the flexible film is to be guided by the support roller, and hence the peeling is stably performed. In addition, when the peeling is performed, the support roller 49 is preferably driven so that the roll surface speed of the contact surface with the flexible film 4 is approximately equal to the moving speed thereof, or the support roller 49 is preferably in a free rotation state. As a result, slipping between the support roller 49 and the flexible film 4 can be prevented, and hence defects such as damages done to the flexible film 4 can be avoided. When the peeling is performed, the support roller 49 may be not in rotation state; however, only when damage done to the surface of the flexible film 4 can be ignored, the roller is not in rotation state.

The peeling unit 40 or 45 may be used instead of the peeling unit 170 of the peeling apparatus 150.

Another embodiment of the peeling method of the present invention will be described using a peeling unit 40 shown in FIG. 8. The primary structure of the peeling unit 40 shown in FIG. 8 is as follows. The peeling unit 40 is composed of the loading table 41 and the peeling mean 42, the loading table 41 being provided for holding the reinforcing plate 2, which is the glass substrate, of the flexible film substrate 6 composed of the reinforcing plate 2 and the flexible film 4 adhered thereto with the removable organic layer 3 interposed therebetween, the peeling member 42 being provided for holding the flexible film 4 and pulling it in the direction extending along the peel angle 38 indicated by the arrow so as to peel away the flexible film 4 from the removable organic layer 3.

The peeling mean 42 holds the end portion of the flexible film 4 and pulls it by the drive source not shown in the figure while the peel angle 38 is maintained in the range of more than 0° and preferably in the range of 1° to 80°, thereby performing the peeling.

Another embodiment of the peeling method of the present invention will be described using a peeling unit 45 shown in FIG. 9. The primary structure of the peeling unit 45 shown in FIG. 9 is as follows. The peeling unit 45 is composed of the loading table 46, the peeling mean 47, and the support roller 49, the loading table 46 being provided for holding the reinforcing plate 2, which is the glass substrate, of the flexible film substrate 6 composed of the reinforcing plate 2 and the flexible film 4 adhered thereto with the removable organic layer 3 interposed therebetween, the peeling mean 47 being provided for holding the flexible film 4 and pulling it in the direction extending along the peel angle 38 indicated by the arrow so as to peel away the flexible film 4 from the removable organic layer 3, the support roller 49 being provided for supporting the flexible film 4 in peeling. A support roller 49 is fitted to the frame 50.

The loading table 46 and the frame 50 are fitted to a base table 48 and can be moved independently of each other in the horizontal direction by drive sources which are not shown in the figure. The support roller 49 may be rotated by the drive source not shown in the figure, may be used as a free roller when being separated from the drive source, or may be fixed so as not to be rotated.

When the peeling mean 47 holds the end portion of the flexible film 4 by the drive source not shown in the figure and pulls it in the direction extending along the peel angle 38 indicated by the arrow in synchronous with the movement of the loading table 46, the flexible film 4 can be peeled away while the peel angle 38 is maintained in the range of more than 0° to 80°.

Alternatively, as another embodiment, when the peeling mean 47 holds the end portion of the flexible film 4 by the drive source not shown in the figure and pulls it in synchronous with the movement of the frame 50 in the direction to the left side in the figure, the peeling can be performed while the peel angle 38 is maintained in the range of more than 0° to 80°.

As another embodiment of the present invention, there may be mentioned a method for peeling the flexible film from the reinforcing plate while at least a part of the reinforcing plate is being curved. More particularly, there is preferably used a method in which after the reinforcing plate is curved, the flexible film is peeled away therefrom while the curved state of the reinforcing plate is being maintained or a method in which the flexible film is peeled away from the reinforcing plate while it is being curved.

Preferable examples of this peeling method and apparatus will be described with reference to figures.

Figure 12A:
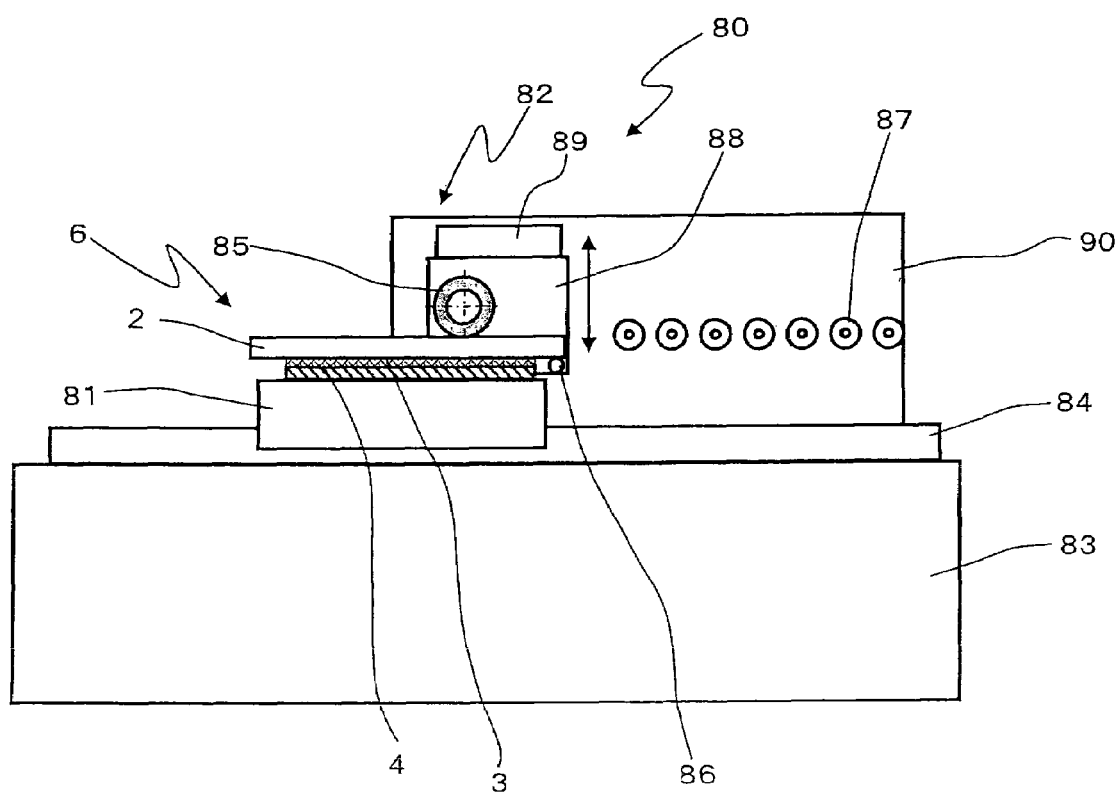
FIGS. 12(a) and 12(b) are schematic front views showing another embodiment of a peeling apparatus according to the present invention.
Figure 12B:
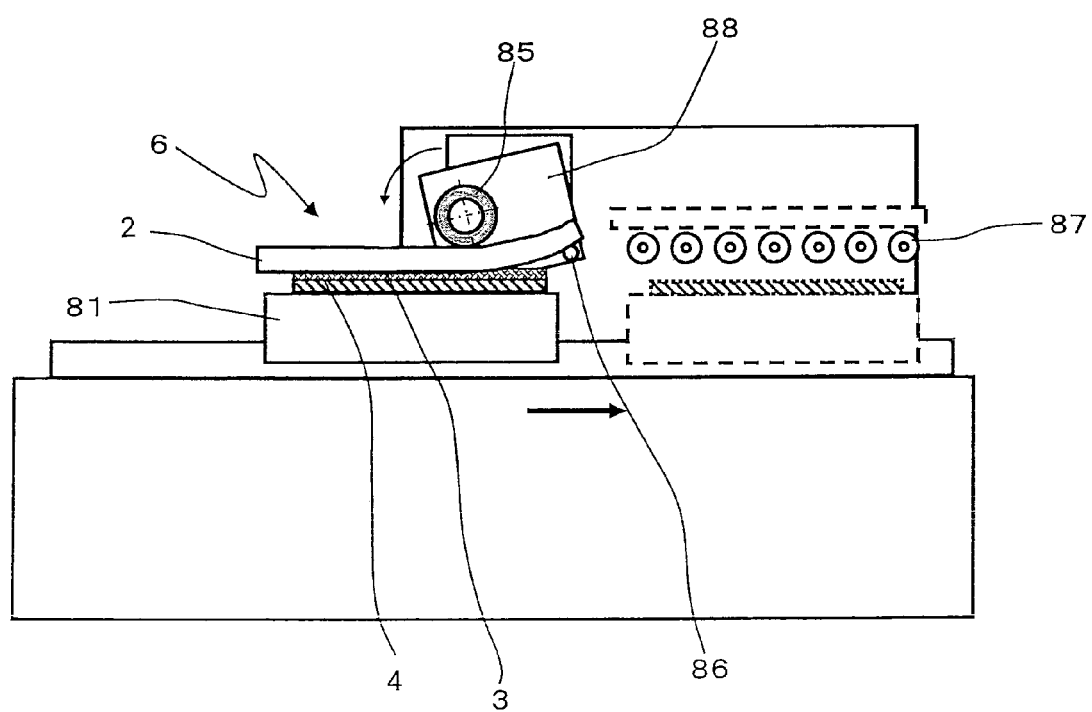
Figure 13:
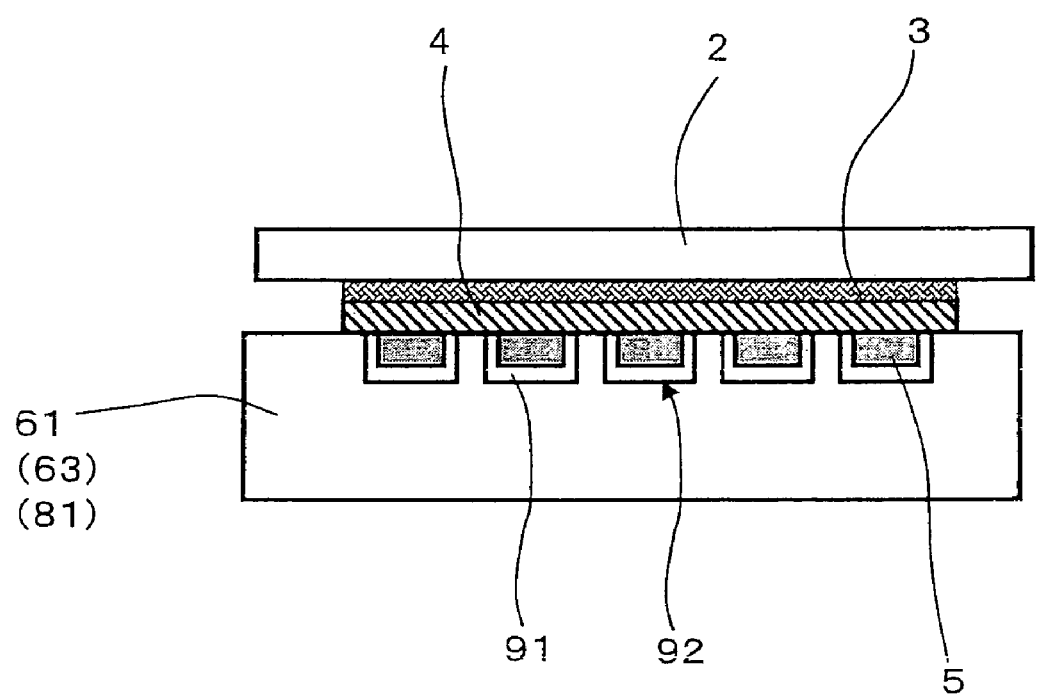
FIG. 13 is a cross-sectional view showing groove shapes formed in loading tables 61, 63, and 81.

FIG. 10 is a schematic front view of a peeling apparatus 60 of the present invention, FIG. 11 is a schematic front view of another embodiment using the peeling apparatus 60, FIG. 12(a) is a schematic front view of another peeling apparatus 80 of the present invention, FIG. 12(b) is a schematic front view showing a peeling status obtained by using the peeling apparatus 80, and FIG. 13 is a schematic front view showing another embodiment of a loading table 81.

First, the peeling apparatus 60 shown in FIG. 10 will be described. In FIG. 10, the peeling apparatus 60 is shown which peels the flexible film substrate 6 composed of a reinforcing plate 2, which is a glass substrate, and a flexible film 4 adhered thereto with the removable organic layer 3 such as a pressure-sensitive adhesive interposed therebetween. The peeling apparatus 60 is composed of a loading table 61, a peeling unit 62, and a loading table 63, the loading table 61 being provided for holding the flexible film substrate 6 at a non-adhering surface thereof, the peeling unit 62 being provided for actually peeling the reinforcing plate 2 away from the flexible film 4, the loading table 63 being provided for receiving the reinforcing plate 2 after peeling.

The loading table 61 and the loading table 63 are fitted to a base table 64 so as to be freely movable up and down and are moved independently of each other by drive sources not shown in the figure. In addition, in the upper surface of the loading table 61 and that of the loading table 63, suction holes are provided so that workpieces placed on the respective tables are to be independently held by vacuum-suction using vacuum sources not shown in the figure.

Next, the peeling unit 62 is composed of a body of rotation 66 having at the surface thereof a holding portion 65 which defines the amount of deformation of the reinforcing plate 2, a frame 68 cantilevering the body of rotation 66 with a shaft 67 so that the body of rotation 66 is freely rotatable thereabout, and a rail 69 freely guiding the frame 68 on the base table 64 in the horizontal direction. The holding portion 65 is formed of an elastic material such as a rubber, and suction holes are provided in the surface. By a vacuum source not shown in the figure, parts to be brought into contact with the reinforcing plate 2 can be performed vacuum-suction. The suction holes provided in the holding portion 65 are formed so that parts at which the reinforcing plate 2 and the holding portion 65 are brought into contact with each other are sequentially sucked. In addition, in order to hold the reinforcing plate 2. while it is being curved, the holding surface of the holding portion 65 has a curved surface.

The curvature radius of the curved surface described above is formed in consideration of the peeling performance and the amount of deformation acceptable for the reinforcing plate 2. The dimension of the curvature radius is preferably in the range of 20 to 1,000 mm and more preferably in the range of 50 to 800 mm. When the reinforcing plate is a glass substrate, the curvature radius is preferably in the range of 400 to 1,000 mm and more preferably in the range of 500 to 800 mm. When the curvature radius is too small, the reinforcing plate may be put outside a plastic deformation region and may be damaged so that peeling thereof cannot be further performed, or the reinforcing plate may be deformed so that reusing of the reinforcing plate after peeling cannot be performed. When the curvature radius is too large, a force for peeling the reinforcing plate becomes deficient, and as a result, peeling cannot be performed in synchronous with the movement of the holding portion 65.

Furthermore, the rotation of the body of rotation 66 and the horizontal movement of the frame 68 are independently performed by drive motors not shown in the figure and are synchronously controlled so that a contact portion between the holding portion 65 and the reinforcing plate 2 is sequentially moved in the horizontal direction (direction indicated by a horizontal arrow in the figure). Since the loading table 61 is freely moved up and down, in peeling the reinforcing plate 2 from the flexible film 4, the loading table 61 is moved in the vertical direction and is stopped at a position at which the reinforcing plate 2 and the holding portion 65 is brought into contact with each other at a predetermined pressure. On the other hand, the loading table 63 is provided for receiving the reinforcing plate 2 thereon which is vacuum-sucked to the holding portion 65 of the peeling unit 62. That is, after the peeling is complete, while vacuum-suction the reinforcing plate 2, the peeling unit 62 is moved to the loading table 63 as shown by dotted lines in FIG. 10. After the distance between the reinforcing plate held, by the holding portion 65 and the loading table 63 is controlled preferably in the range of 0.1 to 3 mm and more preferably in the range of 0.1 to 1 mm by moving the loading table 63 in the vertical direction, the vacuumsuction is released so as to separate the reinforcing plate 2 from the holding portion 65, and as a result, the reinforcing plate 2 is transferred onto the loading table 63.

Next, a method for peeling the flexible film 4 using the peeling apparatus 60 shown in FIG. 10 will be described.

After the loading table 61 is moved to the lowest point, by transfer means not shown in the figure, the flexible film substrate 6 is placed on the loading table 61 so that the flexible film 4 is located at the lower side (the reinforcing plate 2 is located at the upper side). Subsequently, the vacuum source not shown in the figure is driven, so that the flexible film substrate 6 is held on the loading table 61 by vacuum-suction. Next, in order to position a start point S of the holding potion 65 of the peeling unit 62 at a position over the right end of the reinforcing plate 2 in the figure, the frame 68 is moved, and the body of rotation 66 is moved by rotation. After the positioning of the holding portion 65 described above is complete, the loading table 61 is moved upward, and the right end of the reinforcing plate 2 and the start point S of the holding portion 65 are brought into contact with each other at a predetermined pressure. The pressure is preferably in the range of 0.001 to 1 MPa and more preferably in the range of 0.01 to 0.2 MPa.

While the state described above is being maintained, the vacuum source not shown in the figure is driven, so that the holding portion 65 is vacuum-sucked to the reinforcing plate 2. Subsequently, the movement of the frame 68 to the left side and the rotation of the body of rotation 66 anticlockwise are synchronously performed, so that the curved surface of the holding portion 65 is sequentially brought into contact with the upper surface of the reinforcing plate 2 from the right side. Accordingly, since being sequentially curved from the right side, the reinforcing plate 2 is being separated from the flexible film 4, and as a result, the peeling between the two described above is sequentially performed from the right side. When an end point E of the holding portion 65 reaches the left end of the reinforcing plate 2, comes into contact with the left end thereof, and passes therethrough, the peeling is complete. When the peeling is complete, the movement of the frame 68 and the rotation of the body of rotation 66 are stopped, and the loading table 61 is moved downward, so that the reinforcing plate 2 and the flexible film 4 are substantially separated from each other.

Subsequently, the body of rotation 66 is rotated clockwise so that the central portion of the reinforcing plate 2 vacuum-sucked to the holding portion 65 is placed at the lowest position. The frame 68 is then moved in the right direction, so that the reinforcing plate 2 held by the holding portion 65 is placed over the loading table 63. Next, the loading table 63 is moved upward so that the space between the upper surface of the loading table 63 and the lowest point of the reinforcing plate 2, which is the central portion thereof, is 0.1 to 1 mm. After the space described above is ensured, the adsorption by the holding portion 65 is released, so that the reinforcing plate 2 is transferred onto the loading table 63. After the transfer is complete, the vacuum-suction by the loading table is released, and by a transfer device not shown in the figure, the separated the reinforcing plate 2 and the flexible film 4 are individually transferred to subsequent steps. Subsequently, after the peeling unit 62 is returned to the original position, the same steps as described above are then repeatedly performed, so that peeling of the following flexible film substrate 6 is performed.

In a peeling apparatus shown in FIG. 11, a holding mean 70 having a hook shape for holding one end portion of the reinforcing plate 2 is fixed to one end of the body of rotation 66 of the peeling apparatus 60 shown in FIG. 10. A material for the holding mean 70 is not particularly limited, and for example, a metal, a resin, and a ceramic may be used. However, a composite structure is preferably used in which a main body is made of a metal and a contact part with the reinforcing plate 2 is made of a soft material such as a rubber or a resin.

A peeling method performed using the peeling apparatus shown in FIG. 11 is as follows.

The loading table 61 is moved down to the lowest position, and the frame 68 is then moved to the right side so that the holding portion 65 is not located over the loading table 61. While the state described above is being maintained, by the transfer means not shown in the figure, the flexible film substrate 6 is placed on the loading table 61 so that the flexible film 4 is located at a lower side (the reinforcing plate 2 is located at an upper side). Subsequently, by using the vacuum source not shown in the figure, the flexible film substrate 6 is held on the loading table 61 by vacuum-suction.

Next, the loading table 61 is moved upward so that a part of the holding mean 70 having a hook shape is placed at a position corresponding to the right end portion of the reinforcing plate 2. Then, the frame 68 is moved to the left side so that the right end portion of the reinforcing plate 2 is fitted into the hook-shaped portion of the holding mean 70 as shown in FIG. 11, and hence the holding mean 70 can hold the right end portion of the reinforcing plate 2. In this case, the gap between the hook-shaped portion of the holding mean 70 and the right end portion of the reinforcing plate 2 in the thickness direction is preferably in the range of 0.1 to 5 mm and more preferably 0.5 to 1.5 mm.

Subsequently, while the state described above is being maintained, by a drive source not shown in the figure, the movement of the frame 68 in the left direction and the rotation of the body of rotation 66 anticlockwise are synchronously performed, so that the curved surface of the holding portion 65 is sequentially brought into contact with the upper surface of the reinforcing plate 2 from the right side. Accordingly, while being curved, the reinforcing plate 2 is sequentially lifted upward from the right end portion thereof so as to be separated from the flexible film 4 which is held by vacuum-suction, and as a result, the two described above are sequentially separated from the right side. When the end point E of the holding portion 65 reaches the left end of the reinforcing plate 2, comes into contact with the left end thereof, and passes therethrough, the peeling is complete. When the peeling is complete, the movement of the frame 68 and the rotation of the body of rotation 66 are stopped, and the loading table 61 is moved downward, so that the reinforcing plate 2 and the flexible film 4 are substantially separated from each other.

Subsequently, the body of rotation 66 is rotated clockwise so that the central portion of the reinforcing plate 2 vacuum-sucked to the holding portion 65 is located at the lowest position. The frame 68 is then moved to the right side so that the reinforcing plate 2 held by the holding portion 65 is placed at a position over the loading table 63. Next, the loading table 63 is moved upward so that the space between the upper surface of the loading table 63 and the lowest point of the reinforcing plate 2, which is the central portion thereof, is 0.1 to 1 mm. After the space described above is ensured, the vacuum-suction by the holding portion 65 is released, so that a part of the reinforcing plate 2 is transferred onto the loading table 63.

Next, the frame 68 is further moved to the right side so that the right end portion of the reinforcing plate 2 is disengaged from the hook-shaped portion of the holding mean 70, and hence the reinforcing plate 2 is totally transferred onto the loading table 63. When the transfer is complete, the loading table 63 is moved downward to the lowest position, and the vacuum-suction by the loading table 63 is released. Next, by the transfer device not shown in the figure, the separated reinforcing plate 2 and the flexible film 4 are individually transferred to subsequent steps. Subsequently, after the peeling unit 62 is returned to the original position, the same steps as described above are then repeatedly performed, so that peeling of the following flexible film substrate 6 is performed.

Next, the peeling apparatus 80 shown in FIGS. 12(*a*) and 12(*b*) will be described.

The peeling apparatus 80 is composed of the loading table 81 directly holding the flexible film 4 side of the flexible film substrate 6 and a peeling unit 81 peeling the reinforcing plate 2 of the flexible film substrate 6 from the flexible film 4. The loading table 81 is guided by a guide 84 provided on a base table 83 and is freely movable along the horizontal direction by a drive source not shown in the figure. In addition, suction holes are provided in the surface of the loading table 81, and by connection with a vacuum source not shown in the figure, the flexible film 4 of the flexible film substrate 6 can be held by vacuum-suction using an vacuum-suction effect obtained from the suction holes.

The peeling unit 82 is composed of a press roller 85, a lift roller 86, these two rollers sandwiching the reinforcing plate 2, and a roller group 87 holding the reinforcing plate 2 after the flexible film 4 is peeled away. The press roller 85 and the lift roller 86 each cantilevered by a rotation table 88 so as to be in a free rotation state. The press roller 85 is preferably a rubber roller. In addition, the rotation table 88 is fitted in a free rotation state to a lift table 89 by a rotation shaft coaxial with the rotation center of the press roller 85. Furthermore, this lift table 89 is fitted to a base frame 90 so as to be freely moved up and down. By the motion of the lift table 89, the rotation table 88 can be freely moved in the vertical direction. In addition, the roller group 87 is also held by the base frame 90 in a free rotation state.

Next, a peeling method using the peeling apparatus 80 will be described with reference to FIGS. 12(*a*) and 12(*b*).

First, the loading table 81 is moved to the left end so as not to interfere with the press roller 85 and the lift roller 86. In the state described above, by transfer means not shown in the figure, the flexible film substrate 6 is placed on the loading table 81 so that the flexible film 4 is located at a lower side (the reinforcing plate 2 is located at an upper side). Subsequently, by driving the vacuum source not shown in the figure, the flexible film substrate 6 is held on the loading table 81 by vacuum-suction.

Next, in the state described above, before the loading table 81 is moved to the right side, the position in the vertical direction and the rotation angle of the rotation table 88 is adjusted so that the reinforcing plate 2 is allowed to pass between the press roller 85 and the lift roller 86 as shown in FIG. 12(*a*). After the preparation described above is complete, the loading table 81 is actually moved to the right side and is stopped at a position at which the under surface at the right end of the reinforcing plate 2 of the flexible film substrate 6 is placed over the lift roller 86, the flexible film substrate 6 being held on the rotation table 88 by adsorption.

Subsequently, the rotation table 88 is moved downward and is stopped at a position at which the press roller 85 presses the, reinforcing plate 2 at a predetermined pressure. The pressure in this case is preferably in the range of 0.001 to 1 MPa and more preferably in the range of 0.01 to 0.2 MPa.

Next, the rotation table 88 is slowly rotated anticlockwise around the center of the press roller 85 as a rotation axis, and as shown in FIG. 12(*b*), the right end of the reinforcing plate 2 is lifted by the lift roller 86, so that the peeling of the reinforcing plate 2 from the flexible film 4 starts. When the right end of the reinforcing plate 2 is lifted to a predetermined level, the anticlockwise rotation of the rotation table 88 is stopped, and the loading table 81 is then moved to the right side at a predetermined speed. As the loading table 81 is moved to the right side, a peel point between the reinforcing plate 2 and the flexible film 4 is moved to the left side, and concomitant with this movement, the peeling progresses. When the left side of the reinforcing plate 2 passes through the press roller 85, the reinforcing plate 2 thus peeled away is then transferred onto the roller group 87 by inertia. After the vacuum-suction by the loading table 81 is released, by a transfer device not shown in the figure, the separated reinforcing plate 2. and the flexible film 4 are individually transferred to subsequent steps.

Subsequently, the loading table 81 is placed back to the original position, and the same steps as described above are repeatedly performed, so that the peeling of the following flexible film substrate 6 is performed.

When a circuit pattern (not shown) is provided on the flexible film 4 or the electronic components 5 such as IC chips are further mounted on the circuit pattern, recess portions 91 are preferably provided in a loading table 61, a loading table 63, and the loading table 81 as shown in FIG. 13 so that the electronic components 5 will not interfere with operations. The change in size of the recess portion 91 may be performed using an adaptor. As for the size of the recess portion corresponding to an IC chip, for example, the depth is 0.5 to 2 mm and the length and the width are each 1 to 20 mm. In addition, a suction hole may also be provided in a bottom surface 92 of the recess portion 91 so that the electronic component 5 is brought into contact with the bottom surface 92 and is then fixed to the loading table by vacuum-suction. Furthermore, the loading table may be formed of a flexible raw material having micropores which can perform vacuum-suction so that the electronic component 5 is buried in this raw material and is fixed by vacuum-suction.

When electronic components such as IC chips are mounted on a circuit board made of a flexible film, concomitantly with increase of force for peeling parts on which the electronic components are mounted, a force is concentrated to the end portions of the electronic components so as to deform the circuit board, and as a result, the reliability may be degraded in some cases; hence, the present invention is particularly effective. In addition, when resin packaging is performed for electronic components such as IC chips, a stress applied to the end portions of the electronic components in peeling is reduced, and as a result, the reliability of the circuit board is preferably improved.

A method for holding the flexible film 4 by the loading tables 61 and 81 is not particularly limited, and besides the vacuum-suction described in the above embodiment, electrostatic suction may also be used. For performing electrostatic suction, it is preferable that the loading table be conductive, and be at a ground potential or an optional voltage be applied in accordance with a method for applying static electricity. In addition, in order to decrease the peeling force of an organic layer, a heating element is preferably provided in or on the loading table. For the same purpose as described above, a heating element is preferably provided for a holding portion 65 of a peeling unit 62.

Since being curved, the reinforcing plate 4 used in the present invention preferably has flexible properties to a certain extent. In particular, the reinforcing plate used in the present invention is preferably curved to have a curvature radius of 1,000 mm or less and more preferably 800 mm or less.

Another embodiment of the peeling method of the present invention will be described using a peeling apparatus 100 with reference to FIGS. 14(*a*) and 14(*b*). That is, a method for forming a circuit board will be described which has the steps of inserting a wedge-shaped peeling member between a flexible film and a reinforcing plate of a circuit board-use member in which a circuit pattern is formed on a surface of the flexible film opposite to that adhered to one surface of the reinforcing plate, and peeling the flexible film from the reinforcing plate.

The primary structure of the peeling apparatus 100 shown in FIGS. 14(*a*) and 14(*b*) is as follows.

The apparatus 100 has a base table 102 on which a rail 101 is provided. On the rail 101, a loading table 103 is provided. This loading table 103 is connected to a ball screw not shown in the figure which is driven by a servomotor, and when the servomotor is driven, the loading table 103 can be reciprocally moved on the rail 101 in the horizontal direction in the figure.

In addition, a frame 104 is provided on the base table 102, and a plurality of free rollers 105 is fitted to this frame 104 in the horizontal direction in the figure at a predetermined height.

Above the rail 101, peeling member 106 freely movable in the vertical direction is provided. This peeling member 106 has a height adjusting mechanism 106*a* formed of an adjusting screw mechanism or the like, holders 106*b* connected to this height adjusting mechanism 106*a*, and a wedge 106*c* fitted to this holders 106*b*. The height adjusting mechanism 106*a* is used for adjusting the height of a blade edge of the wedge 106*c*, and by this mechanism, when the peeling member 106 is moved downward, the blade edge 106*c* can be precisely aligned to the interface between the flexible film 4 and the removable organic layer 3 of the flexible film substrate 6 as described later. In addition, as shown in FIG. 15, the peeling means 106 is formed to have a fixed-beam structure, and as described later, the flexible film peeled away from the reinforcing plate is allowed to pass through between the holders 106*b*.

Figure 14A:
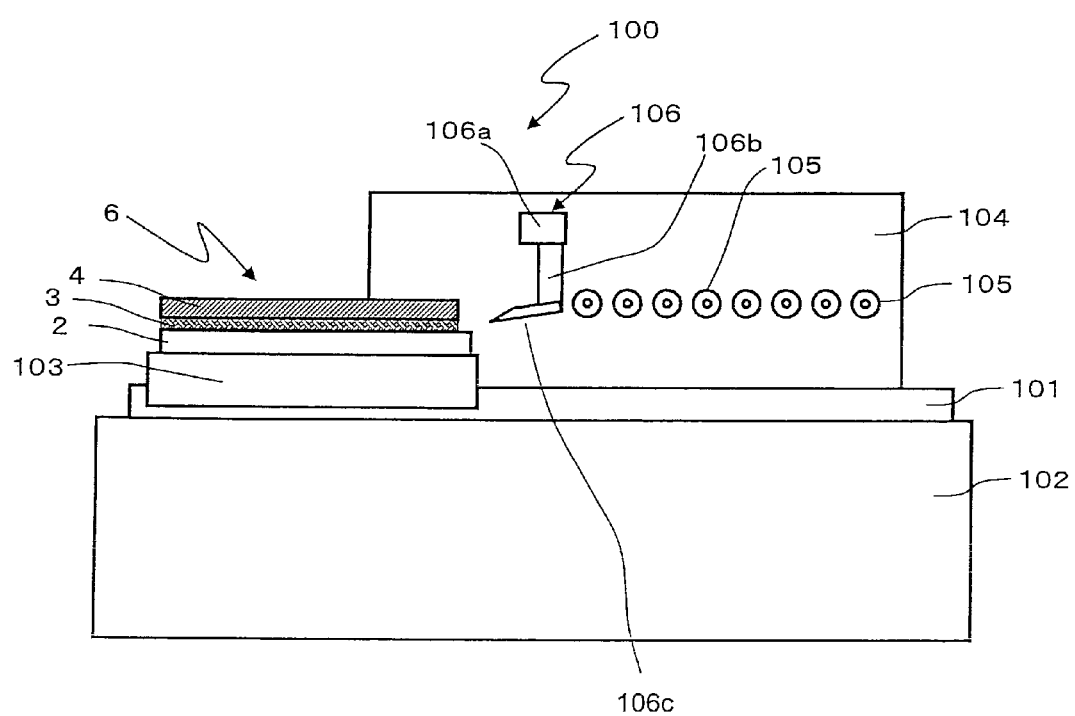
FIGS. 14(a) and 14(b) are schematic front views showing another embodiment of a peeling apparatus according to the present invention.
Figure 14B:
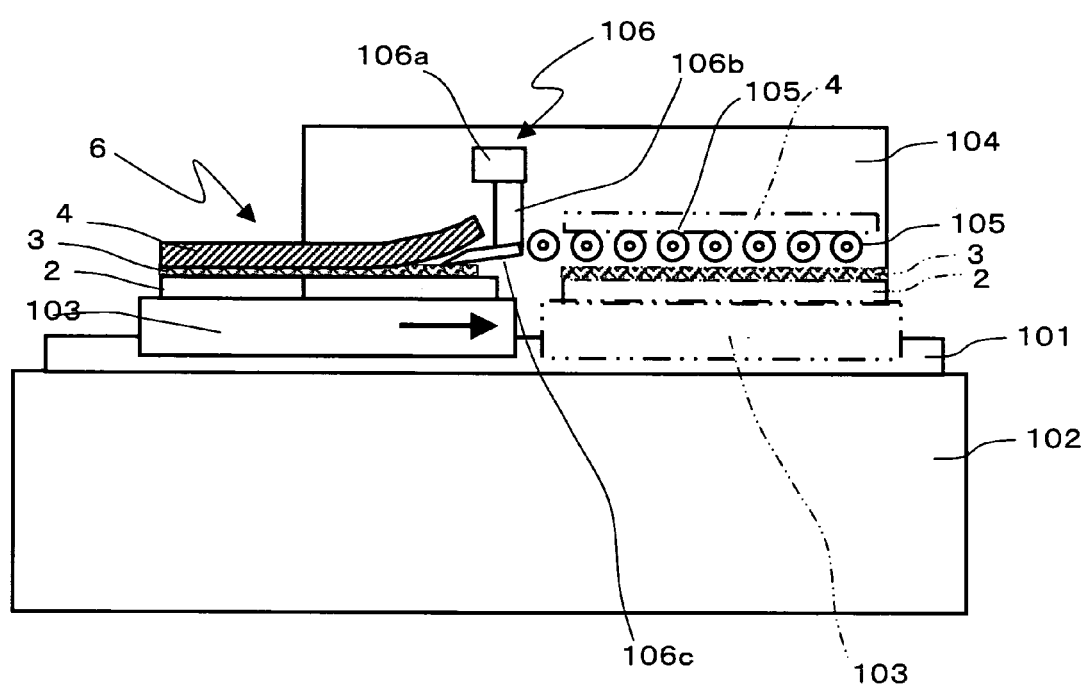

In the apparatus of this embodiment, first as shown in FIG. 14(*a*), the flexible film substrate 6 is placed on the loading table 103 and is fixed thereto. This flexible film substrate 6 has the reinforcing plate 2 and the flexible film 4 adhered thereto with the removable organic layer 3 interposed therebetween, the flexible film 4 having a circuit pattern on the surface opposite to that adhered to the reinforcing plate 2.

Next, as the peeling means 106 is moved downward, the loading table 103 is moved on the rail 101 in the direction (right side in the figure) indicated by an arrow at a predetermined speed. When the loading table 103 is moved, concomitantly with this movement, as shown in FIG. 14(*b*), the wedge 106*c* of the peeling member 106 is inserted between the flexible film 4 and the removable organic layer 3 of the flexible film substrate 6, so that the flexible film 4 is peeled away from the removable organic layer 3. That is, the flexible film 4 is peeled away and separated from the reinforcing plate 2.

Figure 15:
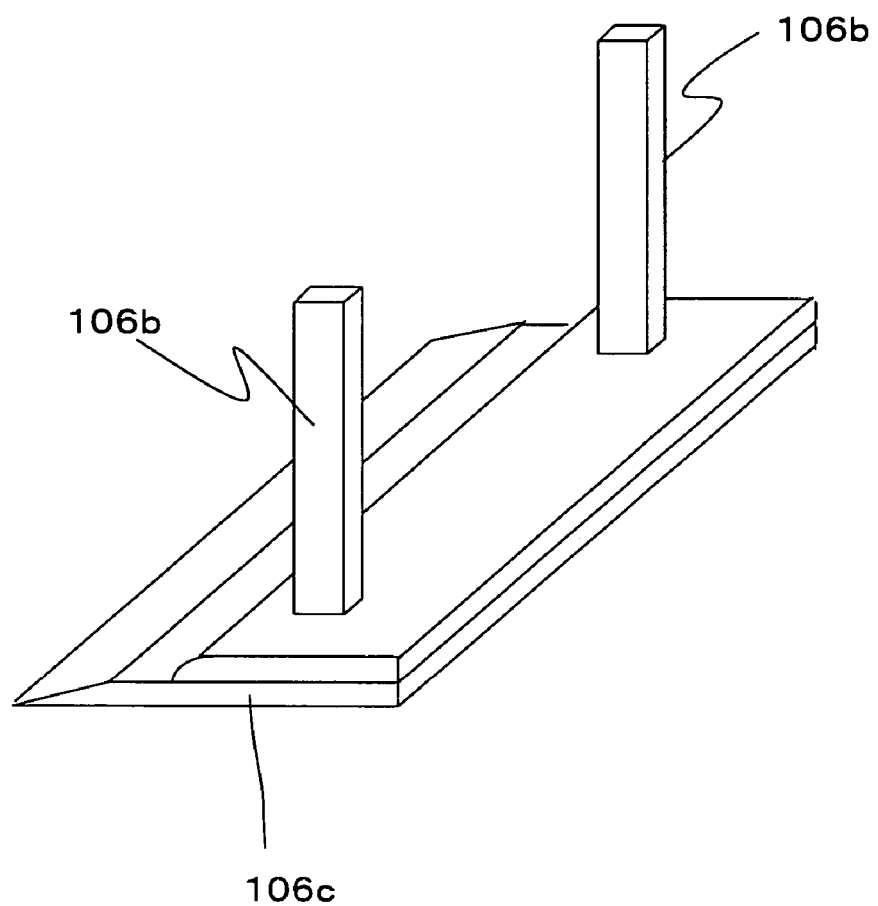
FIG. 15 is a schematic perspective view showing a major portion of peeling means in FIG. 14.

As the loading table 103 is further moved, the flexible film 4 thus separated passes through between the holders 106*b* of a peeling means 106 shown in FIG. 15 and is then placed on the free rollers 105 as shown by a two-dot chain line in FIG. 14(*b*), and the flexible film 4 is then transferred to a subsequent step by transfer means not shown in the figure.

Next, as the peeling member 106 is moved up to the position at which it was located before descending, the loading table 103 is also moved to the left side in the figure. When the loading table 103 is returned to the original position, a remaining flexible film substrate, which is provided on the loading table 103 and which remained after the flexible film 4 is peeled and separated from the flexible film substrate, is removed by transfer means not shown in the figure, and a new flexible film substrate is placed on the loading table 103. Hereinafter, by repeatedly performing the same procedure as described above, the circuit boards are continuously formed.

In the case described above, although depending on the blade-edge angle of the wedge, the type of adhesive or pressure-sensitive adhesive forming the removable organic layer of the flexible film substrate, i.e., the bonding force, and the like, when the moving speed of the loading table is too high, a surface obtained by peeling may become irregular, or wrinkles may be formed on the flexible film obtained by peeling, and on the other hand, when the speed is too low, the production efficiency is degraded; hence, the speed is preferably set in the range of approximately 50 to 1,000 mm/minute.

In peeling, when the flexible film substrate is heated, the adhesion between the reinforcing plate and the flexible film is decreased, and hence the peeling can be performed at a lower stress. Although the peeling of the flexible film from the reinforcing plate may be performed before electronic components such as IC chips, resistors, and capacitors are bonded onto a circuit pattern formed on the flexible film, handling can be easily performed when the flexible film is supported by the reinforcing plate, and in addition, a highly precise bonding can be obtained.

The peeling apparatus described above preferably has heating means for the flexible film substrate. The heating means may be embedded in the loading table, or an infrared lamp, a hot-air blower, or the like may be provided so as to face the loading table.

The peeling means preferably has a positioning system for the peeling member. By this mechanism, the wedge-shaped peeling member can be precisely aligned to a predetermined position of the flexible film substrate, and hence the peeling of the flexible film can be more precisely performed. The positioning system described above may be formed, for example, of the adjusting screw mechanism described above.

The wedge-shaped peeling member is formed, for example, of tool steel having superior cutting properties. A wedge having a single-edged blade is preferable. A wedge having a double-edged blade may also be used; however, when a wedge having a double-edged blade is used for peeling a flexible film, the peel angle becomes large as compared to that by a wedge having a single-edged blade, and hence a strain is liable to be applied to the flexible film. When the blade-edge angle is excessively large, the peel angle is increased, and as a result, the flexible film may be curled or may be bent in a serious case. On the contrary, when the blade-edge angle is excessively small, the mechanical strength may not be ensured, and hence the blade-edge angle is set in the range of 5 to 30° and preferably 5 to 20°. In addition, in order to decrease an apparent blade-edge angle, the wedge is preferably used so that the blade edge faces the insertion face with a slightly inclined angle.

Moving means for relatively moving holding member for holding a circuit board-use-member and the peeling member is obtained when the peeling member is moved; however, in general, the peeling member is fixed, and the holding means is moved. For example, the means described above may be formed so as to have a base table and a rail provided thereon. On the rail, the loading table described above is placed. The loading table can be moved back and force on the rail, for example, by a ball screw mechanism driven by a servomotor.

Hereinafter, a preferable example of a method for forming a circuit board, according to the present invention, will be described; however, the present invention is not limited thereto.

An aluminoborosilicate glass having a thickness of 1.1 mm is used as the reinforcing plate, and the removable organic layer is formed on one surface thereof by coating. As coating methods, the methods described above may be used, and in order to form uniform coating films on substrates which are intermittently fed in accordance with a single sheet processing system, a die coater is preferably used. After the application of the removable organic layer, drying is performed by heat drying or vacuum drying, so that a removable organic layer having a thickness of 2 μm is formed. A moisture blocking film is adhered onto the removable organic layer and is then held for 1 week, the film being formed from exfoliate film composed of a polyester film and a silicone resin layer provided thereon. This holding period is called ageing, and since crosslinking of the removable organic layer progresses, the adhesion is gradually decreased. The holding period and temperature may be selected so as to obtain a desired adhesion. Instead of using an air blocking film, the removable organic layer may be held in a nitrogen or a vacuum atmosphere. After being applied to a long film base material and then being dried, the removable organic layer may be transferred onto the reinforcing plate.

Next, a polyimide film having a thickness of 25 μm is prepared. The moisture blocking film on the removable organic layer is peeled away, and the polyimide film is adhered onto the glass substrate. As described above, a metal layer (or a circuit pattern) may be formed beforehand on at least one of two surfaces of the polyimide film. In the case in which the metal layer is provided on a surface of the polyimide film which is to be adhered to the glass substrate, the metal layer may be used, for example, as a ground layer for electromagnetic shielding. The polyimide film may be cut into a predetermined size and is then adhered, or while the polyimide film is being unwound from a long roll, adhering and cutting process may be performed. In the adhering process mentioned above, a method proposed in International Publication No. WO 03/009657 pamphlet by the inventors of the present invention is preferably used in which after being held on a surface of a film holding sheet, a polyimide film is then pressed onto a glass substrate so that the polyimide film is highly precisely laminated onto the glass substrate side at a low stress. Hereinafter, a method for forming a laminate and an apparatus therefor will be described by way of example with reference to figures, the method having the steps of holding a polyimide film on a surface of a film holding sheet, and then pressing the polyimide film onto the glass substrate side.

Figure 17:
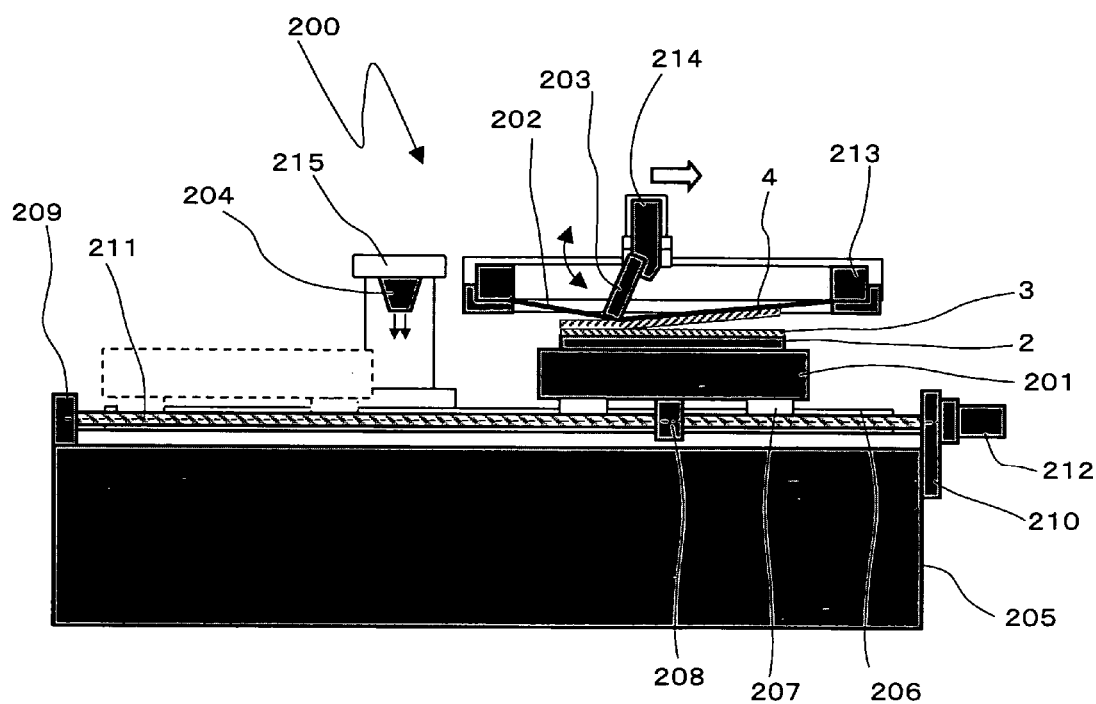
FIG. 17 is a schematic front view of a laminator preferably used in the present invention.

FIG. 17 is a schematic front cross-sectional view (cross-sectional portions are shown by black areas and by areas of oblique lines) of a central portion of a laminator 200.

A laminator 200 is composed of a loading table 201 holding the reinforcing plate 2, a film holding sheet 202 holding the flexible film 4 disposed over the reinforcing plate 2, a squeegee 203 simultaneously pressing the film holding sheet 202 and the flexible film 4 onto the reinforcing plate 2 with a pressure, and an electrostatic charging device 204 imparting an electrostatic suction force to the flexible film 4 so as to be attached to the film holding sheet 202. In the upper surface of the loading table 201, suction holes are provided, and hence the reinforcing plate 2 can be held by suction using a function of a vacuum source not shown in the figure. In addition, the loading table 201 is movable in the horizontal direction in FIG. 17 by a guidance function of a guide 207 engaged with a rail 206 provided on a base table 205. At the lower side of the loading table 201, a nut 208 is also provided and is engaged with a ball screw 211 which is held in a free rotation state by brackets 209 and 210, and in addition, the ball screw 211 is directly connected to a motor 212 provided on a side surface of the base table 205 with the bracket 210 interposed therebetween; hence, the loading table 201 can be freely reciprocated at an optional speed by the rotation of the motor 212.

The film holding sheet 202 is a flexible web or a thin film material fixed in a frame 213. Since the frame 213 can be reciprocally moved up and down by operation of a linear cylinder not shown in the figure which is freely movable in the vertical direction, the flexible film 4 held by the film holding sheet 202 and the reinforcing plate 2 can be disposed approximately parallel to each other, and the space therebetween can be optionally determined.

A squeegee holder 214 is movable in the horizontal direction in FIG. 17 by a mechanism including a rail and a guide not shown in the figure. In addition, the squeegee holder 214 is directly connected to a rotary cylinder not shown in the figure so as to be freely rotatable thereabout. Hence, a squeegee 203 fixed to the squeegee holder 214 is also freely rotatable, and by rotational movement in the direction shown by an arrow in the figure, the squeegee 203 can be pressed onto the film holding sheet or can be separated therefrom. In addition, since being supported by the linear cylinder which is not shown in the figure and which drives the frame 213 in the vertical direction, the squeegee holder 214 can be simultaneously moved in the vertical direction together with the film holding sheet 202.

An electrostatic charging device 204 extends in the width direction of the loading table 201 to have a length larger than that in the width direction of the loading table 201 and is supported by a support pillar 215 provided on the base table 205. The support pillar 215 is moved by a vertical movement mechanism not shown in the figure so that the electrostatic charging device 204 will not interfere with the frame 213 and the squeegee holder 214, which are moved in the horizontal direction in FIG. 17. The electrostatic charging device 204 sprays ionic air having a negative or a positive charge onto a workpiece disposed thereunder, the stream of the ionic air having a width at least equivalent to that of the loading table 201, and when the flexible film 4 sucked to the loading table 201 passes under the electrostatic charging device 204, a suction force by electrostatic charge can be imparted to the flexible film 4. In addition, as is the case described above, when the electrostatic charging device 204 passes over the film holding sheet 202, a suction force by electrostatic charge can also be imparted to the film holding sheet 202. In this embodiment, the upper surface of the reinforcing plate 2 is coated with the removable organic layer 3 beforehand.

Figure 18:
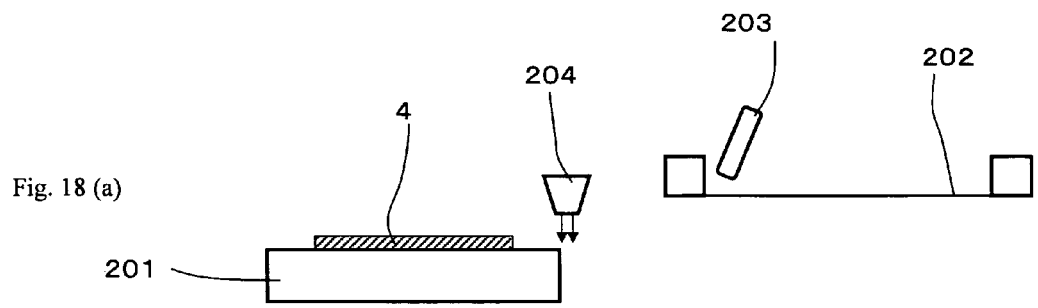
FIG. 18 includes views for illustrating an embodiment of a laminator preferably used in the present invention.
Figure 18:
Figure 18:
Figure 18:
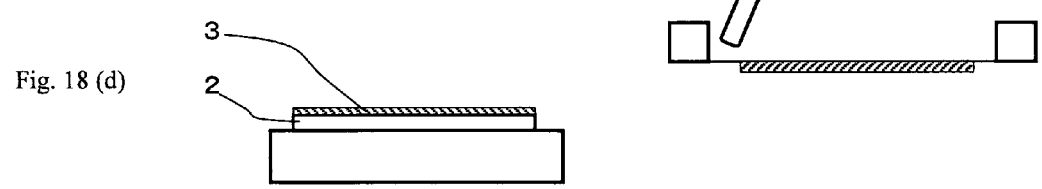
Figure 18:
Figure 18:

Next, a lamination method using the laminator 200 will be described with reference to FIGS. 17 and 18. FIG. 18 includes schematic front views showing a procedure of a lamination method of the present invention.

First, the loading table 201 is moved to the left end shown by a dotted line in FIG. 17 and is then stopped, and by a transfer device (not shown), the flexible film 4 is placed on the loading table 201 and fixed by suction (FIG. 18(a)). Next, while the loading table 201 is being moved to the right side at a predetermined rate, the flexible film 4 is allowed to pass under the electrostatic charging device 204 which sprays positively charged ionic air in a downward direction, so that the flexible film 4 is positively charged. When reaching a position right under the film holding sheet 202, the loading table 201 is stopped, and the suction of the flexible film 4 is released. Next, by driving the linear cylinder not shown in the figure downward, the film holding sheet 202 is moved close to the flexible film 4 and is then stopped when the space therebetween becomes a predetermined value (FIG. 18(b)). The space between the flexible film 4 and the film holding sheet 202 is preferably 10 mm or less; however, the surface of the flexible film 4 and that of the film holding sheet 202 may also be brought into contact with each other. Subsequently, after the squeegee 203 is pressed onto the upper side (opposite to the surface holding the flexible film 4) of the film holding sheet 202 so as to sandwich the film 4 between the film holding sheet 202 and the upper surface of the loading table 201, the squeegee 203 is moved from the left side to the right side of the flexible film 4, so that the flexible film 4 on a squeegee 203 is transferred to the film holding sheet 202 by an electrostatic force (FIG. 18(c)).

When the flexible film 4 is held by the film holding sheet 202, the squeegee 203 is pulled back from the film holding sheet 202, and the film holding sheet 202 is moved upward and is placed in a waiting state. In this step, the squeegee 203 is moved to the left end and is stopped, and in addition, the loading table 201 is again moved to the left end by driving the motor 212 and is then stopped. Next, by a transfer device (not shown), the reinforcing plate 2 having the removable organic layer 3 beforehand at the upper side is placed on the loading table 201 and is fixed by vacuum-suction (FIG. 18(d)). After the fixation, the loading table 201 is moved to the right side and is stopped so that the reinforcing plate 2 is placed at a position right under the flexible film 4 held by the film holding sheet 202 (FIG. 18(e)). In this step, the stop position of the loading table 201 is determined so that the flexible film 4 can be laminated on a predetermined position of the reinforcing plate 2.

Next, the film holding sheet 202 is moved down close to the reinforcing plate 2 on the loading table 201 and is then stopped when the space between the flexible film 4 and the reinforcing plate 2 reaches a predetermined value. The space between the flexible film 4 and the reinforcing plate 2 is preferably 10 mm or less. Subsequently, the squeegee 203 is pressed onto the upper side of the film holding sheet 202, so that the flexible film 4 held by the film holding sheet 202 is pressed onto the reinforcing plate 2 on the loading table 201. Then, the squeegee 203 is moved from the left side to the right side of the flexible film 4, so that the flexible film 4 held by the film holding sheet 202 is transferred onto the reinforcing plate 2 on the loading table 201 (FIG. 18(f)). By the movement described above, the flexible film 4 is laminated onto the reinforcing plate 2, and by the adhesion of the removable organic layer 3, they are tightly adhered to each other. When the squeegee 203 is moved past the right side of the flexible film 4 and is then stopped, by rotation of the rotary cylinder not shown in the figure, the squeegee 203 is pulled back from the film holding sheet 202. Subsequently, the film holding sheet 202 is moved upward, and after the adsorption of the loading table 201 is released, by a transfer device (not shown), the reinforcing plate 2 on the loading table 201 which is laminated with the flexible film 4 is transferred to a sequential step. Hereinafter, the same steps as described above are repeatedly performed, so the lamination is performed for the following flexible film 4 and the reinforcing plate 2.

According to the lamination method of the present invention, by the following reasons, a highly precise laminate can be formed at a low stress. First, when the flexible film on the loading table 201 is held by the film holding sheet 202, the flexible film 4 can be transferred as it is thereto without any substantial change in dimension. The reasons for this are as follows. That is, 1) since the film holding sheet 202 which is an in-plane plastic deformable sheet is used, it conforms to the irregularities of the loading table 201 and the flexible film 4, and hence the surface of the flexible film 4 can be uniformly maintained; and 2) since the space obtained when the flexible film 4 and the film holding sheet 202 facing thereto are moved toward each other is set to be small, such as 10 mm or less, when the squeegee 203 is pressed and is moved, an angle θ (see FIG. 18(c)) between the film holding sheet and the loading table 201 is decreased to 5° or less. Accordingly, as is the case in which the film holding sheet 202 is moved close to the flexible film 4 approximately in parallel to each other so as to transfer the flexible film 4, the flexible film 4 can be transferred to the film holding sheet 202 from the loading table 201 without changing the relative positional relationship between the flexible film 4 and the loading table 201 to that between the flexible film 4 and the film holding sheet 202; hence, strain is not generated in the flexible film 4, and the change in dimension does not occur. In addition, 3) since the press portion of the squeegee 203 has a linear shape, deformation of the film holding sheet 202 and that of the flexible film 4 caused by the press are not generated, and in addition, air discharge can be efficiently performed in a lamination step.

When the flexible film 4 held by the film holding sheet 202 without any dimensional change is transferred (laminated) onto the reinforcing plate 2 coated with the removable organic layer 3, as is the case described above, the flexible film 4 held by the film holding sheet 202 can be transferred as it is onto the reinforcing plate 2. The reasons for this are also as follows. That is, 1) since the film holding sheet 202 which is an in-plane plastic deformable sheet is used, it conforms to the irregularities of the surface of the reinforcing plate 2, so that the flexible film 4 can be uniformly brought into contact with the reinforcing plate 2; and 2) since the space between the film holding sheet 202 and the reinforcing plate 2 is small, such as 10 mm or less, when the squeegee 203 is pressed, an angle φ (see FIG. 18(f)) between the film holding sheet 202 and the reinforcing plate 2 is decreased to 5° or less. Accordingly, as is the case in which the flexible film 4 is moved close to the reinforcing plate 2 approximately in parallel to each other and is transferred to the reinforcing plate 2, the flexible film 4 can be transferred onto the reinforcing plate 2 from the film holding sheet 202 without changing the relative positional relationship between the flexible film 4 and the film holding sheet 202 to that between the flexible film 4 and the reinforcing plate 2; hence, strain is not generated in the flexible film 4, and the change in dimension does not occur. In addition, 3) since the press portion of the squeegee 203 has a linear shape, deformation of the flexible film 4 caused by the press is not generated, and in addition, air discharge can be efficiently performed in a lamination step.

As is the front end used as a press portion, the squeegee 203 preferably has an edge shape in order to linearly perform the press; however, a round shape having a radius of 5 mm or less may also be used. A material for the front end portion may be a hard material such as a metal, a ceramic, or a synthetic resin, and in addition, in order to uniformly perform the press, a rubber having a Shore hardness of 50 to 90 may also be used. In addition, in order to improve the sliding properties of the squeegee 203 when it is pressed onto and is moved along the film holding sheet 202 and in order to suppress the generation of dust, a fluorinated resin is also preferably applied onto the squeegee 203 and the film holding sheet 202. Furthermore, in order to more efficiently suppress the generation of dust, the squeegee 203 may be a free-rotation press roller. As the press roller, a metal roller and a rubber-coated roller may both be used, and in order to press the sheet linearly as much as possible, and in order to avoid the generation of air bubbles, a roller having a small diameter, such as 30 mm or less, is preferably used. The intensity of the press by the squeegee is preferably 5 to 500 N/m and more preferably 10 to 100 N/m. The moving speed of the squeegee in a lamination step is preferably 0.1 to 50 m/minute and more preferably 5 to 15 m/minute.

As the film holding sheet 202, an in-plane plastic deformable sheet must be prepared, and in addition, a flexible web or a thin film material is preferably used. In addition, as the frame 213 supporting the film holding sheet, a frame having a sufficient strength and flatness is preferable, and a metal, a synthetic resin, a fiber-reinforced resin or the like is preferably used.

As the flexible web mentioned above, a mesh web of polyester, polypropylene, liquid crystal polymer, or stainless steel fibers is preferably used. In addition, by using a photosensitive coating film or the like, an opening portion and a closing portion may be formed. As the film material of the present invention, a plastic film made of polyester, polyimide, polyphenylene sulfide, or the like may be used. In addition, by cutting the plastic film mentioned above, an opening portion may be formed. Furthermore, a hard rubber may also be used.

As a method for holding the flexible film 4 by the film holding sheet 202, besides the electrostatic suction described above, the surface tension of liquid, adhesion of an organic material, vacuum suction, or the like may be used, and among those mentioned above, the surface tension of liquid, electrostatic suction, or adhesion of an organic material is preferably used since the balance between the holding force and the peeling force can be easily obtained, and the device used for that is not so large. Methods for using the surface tension of liquid and the electrostatic suction are preferable since the repetitive durability and the reproducibility are superior to that of the method for using the adhesion of an organic material.

As the method for using the electrostatic suction, when one of the film holding sheet 202 and the flexible film 4 can be charged or two of them are charged so as to have opposite polarities to each other, any method may be used. As a particular method for charging the film holding sheet 202 or the flexible film 4, besides the method supplying positive or negative ionic air, when being conductive, the film holding sheet 202 can be adhered to the flexible film 4 by applying a high voltage. Furthermore, when a metal film is formed on the surface of the flexible film 4, by applying a high voltage to the metal film, the film holding sheet 202 and the flexible film 4 can be adhered to and held with each other.

As a particular example of a method for using the surface tension of liquid, a method may be mentioned in which, before the flexible film 4 is held by the film holding sheet 202, liquid is adsorbed onto the surface of the flexible film 4 or the film holding sheet 202 by coating, spraying, or dew condensation, and the two described above are then overlapped with each other to form a thin liquid layer therebetween. A method is also effective in which after liquid is sprayed beforehand onto the contact surface of the flexible film 4 and that of the film holding sheet 202, and two described above are overlapped with each other, the squeegee is moved along the surface opposite to the contact surface while pressure is applied thereto so as to form a thin liquid layer between the film holding sheet 202 and the flexible film 4. In addition, after the film holding sheet 202 of a flexible web having an opening portion and the flexible film 4 are brought into contact with each other in a dry state, by spraying liquid to the film holding sheet 202 from the side opposite to the contact portion therebetween, liquid can be supplied between the film holding sheet 202 and the flexible film 4 through the opening portion by using a squeegee, and in this case, since the supply of liquid and the squeezing can be simultaneously performed, the line cycle time can be preferably decreased. As the liquid imparting the adhesion, since having a relatively high surface tension and being unlikely to be formed into impurities, water is preferably used. In addition, for adjusting the surface tension, alcohol or the like may be optionally added to water.

As an example of a method using the adhesion of an organic material, an adhesive layer having tackiness may be provided on the contact surface between the film holding sheet 202 and the flexible film 4 in some cases. In this case, since the adhesion and the peeling force can be well balanced, and repetitive durability can be improved, a method is preferably used in which pressure-sensitive adhesives with high to low adhesion strengths are formed into a layer having a dot matrix pattern or a stripe pattern to decrease the adhesion so that the flexible film 4 is easily peeled away from the film holding sheet 202. Since the adhesion and the peeling force can be well balanced, and the holding force for the flexible film can be sufficiently ensured, it is preferable that the dots have a diameter of 0.1 to 2 mm and be disposed at intervals of 1 to 10 mm.

A circuit pattern is formed on a surface of the polyimide film opposite to that adhered to the reinforcing plate by the full additive or semi-additive method described above. Alternatively, after a continuous single metal layer having a thickness of 5 to 10 μm is formed on the surface of the polyimide film opposite to that adhered to the reinforcing plate, a circuit pattern may also be formed by a subtractive method. The solid metal layer may be formed after or before the polyimide film is laminated on the glass substrate. On the entire or part of the circuit pattern thus formed, gold, nickel, tin or the like may be plated for oxidation inhibition or connection with electronic components.

In addition, in forming the metal layer (circuit pattern), connection holes may be provided in the polyimide film. That is, in order to ensure electrical connection with the metal layer provided on the surface of the polyimide layer to be adhered to a single-sheet substrate, via holes may be provided, or holes in which balls of a ball-grid array are placed may be provided. As methods for forming the connection holes, laser perforation using a carbon dioxide laser, YAG laser, excimer laser, or the like, or chemical etching may be employed. When laser etching is employed, a metal layer is preferably formed as an etching stopper layer on the surface of the polyimide film to be adhered to the reinforcing plate. As a chemical etchant solution for the polyimide film, hydrazine, an aqueous potassium hydroxide solution, or the like may be used. As a mask used for chemical etching, a patterned photoresist or metal layer may be used. In order to obtain electrical connections, after connection holes are formed, the inner surfaces of the holes are preferably plated so as to be electrically conductive simultaneously with the formation of the metal layer pattern described above. The connection hole for electrical connection preferably has a diameter of 15 to 200 μm. The hole for placing the ball preferably has a diameter of 50 to 800 μm and more preferably 80 to 800 μm.

Whenever necessary, a solder resist layer is formed on the circuit pattern. According to one embodiment of the present invention, the solder resist functions as a peeling-assist layer and has an effect of peeling the polyimide film provided with a circuit pattern from the glass substrate without causing any folding or curling of the polyimide film. As the solder resist, a photosensitive solder resist or a thermosetting solder resist may be used. Of those mentioned above, a photosensitive solder resist is more preferably used for a fine circuit pattern. After the solder resist is applied onto a circuit pattern by a spin coater, blade coater, roll coater, bar coater, die coater, or screen printing machine, followed by drying, in the case of a photosensitive solder resist, ultraviolet exposure using a predetermined photomask and development are performed, thereby forming a solder resist pattern. By curing at a temperature of 100 to 200° C. for a predetermined time, the formation of the solder resist is complete.

After a polyimide film having a circuit pattern is peeled away from the reinforcing plate, electronic components may be bonded to the circuit pattern; however, when electronic components are bonded to a polyimide film having a circuit pattern when it is adhered to the glass substrate, from the formation of a circuit board to a step of mounting electronic devices, control of temperature and humidity and damp-proof packaging are not necessary. Since a flexible film is liable to be irreversibly changed in dimension by absorption of moisture, when electronic components are bonded to a polyimide film which has a circuit pattern and is adhered to the glass substrate, a significant effect of ensuring the connection accuracy between the circuit pattern and the electronic components can be obtained.

As an electronic-component mounting device which can be used in the present invention, any device may be used as long as it has an optical position detecting function and an alignment function such as a movable stage and can ensure the mounting accuracy. According to the present invention, a significant effect can be obtained which ensures the mounting accuracy of LSIs in which connection pitches are small and the number of pins is large. Package structures of LSIs are not particularly limited, and the present invention may be applied to bare chips, lead frame types, and ball grid array types; however, the present invention is preferably applied to bare chips in which the number of pins can be increased with a finer pitch.

In addition, a connection method used in the present invention between electronic components and a circuit board is not particularly limited; however, in order to ensure the positional accuracy and to improve the productivity, a method for simultaneously connecting many connection portions is preferable. As a method for simultaneously connecting many connection portions, for example, there may be mentioned a method in which a metal layer of tin, gold, solder, or the like formed on connection portions of a circuit board and a metal layer of gold, solder, or the like formed on connection portions of electronic components are metal-bonded to each other by thermo-compression bonding; a method in which while a metal layer of tin, gold, solder, or the like formed on connection portions of a circuit board and a metal layer of gold, solder, or the like formed on connection portions of electronic components are being pressed to each other, an isotropic conductive adhesive or a non-conductive adhesive disposed between the circuit board and the electronic components is cured so as to perform mechanical bonding; or a method in which after electronic components are temporarily fixed to a solder paste which is pattern-printed on connection portions, connections are formed by a simultaneous reflow process.

In accordance with one embodiment of the present invention, the peeling-assist layer is formed on the flexible film provided with a circuit pattern and electronic components and is then peeled away from the reinforcing plate together with the flexible film. As a peeling method, the method described above is preferably used. After the peeling, whenever necessary, the peeling-assist layer is removed from the flexible film, thereby forming a film circuit board.

In a general circuit pattern, wiring directions are deviated, and large-length wires tend to be aligned in a particular direction in many cases. In the case described above, peeling is preferably performed in the direction perpendicular to that in which the large-length wires are aligned since deformation of the film can be reduced. Furthermore, the removable organic layer is preferably heated and softened so as to reduce a peeling force since the deformation of the film can be further suppressed.

Since handling after peeling can be easily performed, it is preferable that before peeled away from the glass substrate, the polyimide film be cut into predetermined pieces or groups thereof by using laser, highly pressurized water jet, or a cutter and be then peeled away from the glass substrate. In addition, in accordance with a work size of an electronic component bonding device, the glass substrate and the polyimide film may be cut into predetermined pieces or groups thereof.

Hereinafter, with reference to examples, the present invention will be further described; however, the present invention is not limited thereto.

EXAMPLE 1

As a flexible film, a polyimide film ("Kapton" 100EN manufactured by Du pont-Toray Co., Ltd.) having a thickness of 25 μm and a size of 300 mm by 302 mm was prepared.

A soda lime glass having a thickness of 1.1 mm and a size of 300 mm by 300 mm, one surface of which was polished, prepared as a reinforcing plate was coated with a mixture of a ultraviolet curable pressure-sensitive adhesive "SK dyne" SW-22 (manufactured by Soken Chemical and Engineering Co., Ltd.) and a curing agent L45 (manufactured by Soken Chemical and Engineering Co., Ltd.) at a mixing ratio of 100 to 3 (on a weight basis), followed by drying at 80° C. for 2 minuets. The thickness of a removable organic layer after drying was set to 2 μm. Next, onto this organic layer, a water-vapor blocking film (a film composed of a polyester film and an easily removable silicone resin layer provided thereon) was adhered and was then held for 1 week.

While the water-vapor blocking film composed of a polyester film and a silicone resin layer was being peeled, the polyimide film was laminated onto the glass provided with the removable organic layer formed thereon by the laminator shown in FIG. 17. In this step, the structure was formed so that three sides of the glass and three sides of the polyimide film were flush with each other and that the remaining one side of the polyimide film protruding from the corresponding one side of the glass by 2 mm. Subsequently, the laminate thus formed was irradiated with ultraviolet rays at 1,000 mJ/cm$^2$ from the glass substrate side, so that a removable agent layer was cured.

Next, by sputtering, an alloy film composed of chromium and nickel at a ratio of 20 to 80 (on a weight basis) having a thickness of 6 nm and a copper film having a thickness of 200 nm were laminated on the polyimide film in that order. A positive photoresist was applied onto the copper film by a spin coater, followed by drying at 80° C. for 10 minutes. Exposure was performed for the photoresist through a photomask, followed by development, thereby forming a photoresist layer 10 μm thick at places at which plating films were not required.

A photomask pattern for test having the following structure was formed.

On each side 3.5 mm long of a regular quadrangle, 60 connection pads (a width of 25 μm, a length of 80 μm, and a pitch of 50 μm) were provided, so that totally 240 pads were disposed. The center of the line of 60 connection pads and the center of the side having a length of 3.5 mm were made to coincide with each other. A lead wire portion having a length of 5 mm and a width of 20 μm was disposed from the center of each connection pad having a width of 25 μm parallel to the long side thereof. On each side 30 mm long of a regular quadrangle, 60 connection pads (a width of 50 μm, a length of 100 μm, and a pitch of 500 μm) were provided, so that totally 240 pads were disposed, the center of this regular quadrangle being made to coincide with the center of the regular quadrangle having a side length of 3.5 mm. Terminals of the lead wire portions extending from the pads of the regular quadrangle having a 3.5 mm-long side were connected to the respective pads of the regular quadrangle having a 30 mm-long side with wires having a width of 20 μm, thereby forming one unit. The units thus formed were uniformly disposed on a substrate having a size of 300 mm by 300 mm to form a matrix of 7 lines and 7 rows with a regular pitch of 40 mm. In addition, for dimensional length measurement, four markers were each formed in the photomask pattern along the diagonal line of the substrate at a position approximately 141 mm apart from the center thereof (disposed parallel to the side with a pitch of 200 mm).

Next, by using the above copper film as an electrode, a copper layer having a thickness of 5 μm was formed by electrolytic plating in a copper sulfate plating solution. The photoresist was removed using a photoresist remover solution, and by soft etching using an aqueous hydrogen peroxide-sulfuric acid base solution, the copper film and the chromium-nickel alloy film provided under the resist layer were removed. Subsequently, on the copper plating film, a tin layer having a thickness of 0.4 μm was formed by electroless plating, thereby forming a circuit pattern.

By using a length measuring machine SMIC-800 (manufactured by Sokkia Co., Ltd.), when the distance between the two points provided for the dimensional length measurement was measured, which was originally approximately 283 mm (distance of 200 mm in an x direction and distance of 200 mm in a y direction), it was ±2 μm with respect to the photomask pattern, and hence the positional accuracy was very accurately maintained.

Next, as the peeling-assist layer, an aqueous solution of poly(vinyl alcohol) at a concentration of 20 percent by weight was coated onto the circuit pattern, followed by drying at 90° C. for 20 minutes. The thickness of a poly(vinyl alcohol) layer after drying was 20 μm.

The polyimide film provided with the circuit pattern was peeled away from the glass substrate by the peeling apparatus shown in FIG. 2(a). The curved surface of the holding portion 14 had a curvature radius of 600 mm, and a polyurethane rubber having a hardness of 70° was used for the holding portion 14. A sample was placed on the loading table 30 so that the glass substrate was brought into contact therewith, and vacuum-suction was performed at 100 hPa. A pressing pressure of the holding portion 14 applied to the flexible film was set to 0.01 MPa. The right-ward moving speed V2 of the frame 18 was set to 0.3 m/minute in peeling. The shaft 16 was connected to the holding portion 14 with a slip ring, and the roll surface speed V1 of the holding portion was set to 0.31 m/minute. In addition, when the tension applied to the polyimide film per unit cross-sectional area exceeded $6.4 \times 10^6$ N/m$^2$, the slip ring was designed to work. The peel angle between the reinforcing plate and the flexible film in peeling was up to 20°.

In the polyimide film provided with the circuit pattern obtained after the peeling, folding, cracking, and curling were not observed, and the result was excellent.

Next, the poly(vinyl alcohol) layer formed on the circuit board was removed by washing using water, followed by drying, thereby forming a film circuit board. By using the dimensional length measuring machine SMIC-800 (manufactured by Sokkia Co., Ltd.), when the distance between the two points provided on the obtained film circuit board for the length measurement, which was originally approximately 283 mm (distance of 200 mm in the x direction and distance of 200 mm in the y direction) in the diagonal line direction, was measured and was compared to the result obtained before the peeling, the change in distance was within ±20 μm, the strain was very small, and hence an excellent result was obtained.

EXAMPLE 2

A circuit pattern was obtained in the same manner as that in EXAMPLE 1. Next, model IC chips each having a size of 4 mm by 4 mm were metal-bonded to the connection pads of the circuit pattern by Flip Chip Bonder FC-70 (manufactured by TORAY Engineering Co., Ltd.) while being heated to 385° C. from the IC chip side. In each of the model IC chips described above, 4 lines each composed of 60 gold plated bumps with a pitch of 50 μm were disposed to form a regular quadrangle. The alignment of the model IC chips with the connection pads of the circuit pattern was satisfactorily performed.

Next, as the peeling-assistance layer, an aqueous solution of poly(vinyl alcohol) at a concentration of 20 percent by weight was applied onto the circuit pattern, followed by drying at 90° C. for 20 minutes. After drying, the thickness of a poly(vinyl alcohol) layer was 20 μm.

In the same manner as that in EXAMPLE 1, using the peeling apparatus shown in FIG. 2(*a*), the polyimide film provided with the circuit pattern connected to the IC chips was peeled away from the glass substrate. However, in the holding portion 14 shown in FIG. 3, the recess portions 36 (5 mm by 5 mm, depth of 1 mm) corresponding to the IC chips were provided. The peel angle between the reinforcing plate and the flexible film was up to 20° in peeling. In the polyimide film provided with the circuit pattern obtained after the peeling, folding, cracking, and curling were not observed, and the result was excellent.

Next, the poly(vinyl alcohol) layer formed on the circuit board was removed by washing using water, followed by drying, thereby forming a film circuit board. By using the dimensional length measuring machine SMIC-800 (manufactured by Sokkia Co., Ltd.), when the distance between the two points provided on the obtained film circuit board for the dimensional length measurement, which was originally approximately 283 mm (distance of 200 mm in the x direction and distance of 200 mm in the y direction) in the diagonal line direction, was measured and was compared to the result obtained before the peeling, the change in distance was within ±20 μm, the strain was very small, and hence an excellent result was obtained.

EXAMPLE 3

A circuit pattern was obtained in the same manner as that in EXAMPLE 1.

Next, a solder resist SN-9000 (manufactured by Hitachi Chemical Co., Ltd.) was pattern-printed on the circuit pattern formed on the polyimide film other than the connection pads by a screen printing machine, followed by drying at 90° C. for 30 minutes. Furthermore, heat curing was performed at 150° C. for 90 minutes, thereby forming a solder resist layer. The thickness of the solder resist after heat curing was 20 μm.

Next, in the same manner as that in EXAMPLE 2, the IC chips were metal-bonded to the connection pads of the circuit pattern. The alignment of the model IC chips with the connection pads of the circuit pattern was satisfactorily performed.

In the same manner as that in EXAMPLE 2, using the peeling apparatus shown in FIG. 2(*a*), the polyimide film provided with the circuit pattern connected to the IC chips was peeled away from the glass substrate. The peel angle between the reinforcing plate and the flexible film was up to 20° in peeling. In the polyimide film provided with the circuit pattern obtained after the peeling, folding, cracking, and curling were not observed, and the result was excellent.

When the distance between the two points provided on the obtained film circuit board for the dimensional length measurement, which was originally approximately 283 mm (distance of 200 mm in the x direction and distance of 200 mm in the y direction) in the diagonal line direction, was measured and was compared to the result obtained before the peeling, the change in distance was within ±20 μm, the strain was very small, and hence an excellent result was obtained. In this example, since the solder resist layer used as the peeling-assist layer can be used as a solder resist after the peeling of the film, it is not necessary to remove it.

EXAMPLE 4

A circuit pattern was obtained in the same manner as that in EXAMPLE 1.

Next, a solder resist "FLEX PHOTO IMAGE MASK" NPR-90 (manufactured by Nippon Polytech Corp) was pattern-printed on the circuit pattern formed on the polyimide film other than the connection pads by a screen printing machine, followed by heat curing at 70° C. for 30 minutes. Subsequently, the solder resist layer was irradiated with ultraviolet rays at 500 mJ/cm$^2$, and heat curing at 150° C. for 30 minutes was further performed. Finally, post exposure was performed by irradiation of ultraviolet rays at 1,500 mJ/cm$^2$, thereby forming a solder resist layer. The thickness of the solder resist after heat curing was 24 μm.

Next, in the same manner as that in EXAMPLE 2, the IC chips were metal-bonded to the connection pads of the circuit pattern. The alignment of the model IC chips with the connection pads of the circuit pattern was satisfactorily performed.

In the same manner as that in EXAMPLE 2, using the peeling apparatus shown in FIG. 2(*a*), the polyimide film provided with the circuit pattern connected to the IC chips was peeled away from the glass substrate. The peel angle between the reinforcing plate and the flexible film was up to 20° in peeling. In the polyimide film provided with the circuit pattern obtained after the peeling, folding, cracking, and curling were not observed, and the result was excellent.

When the distance between the two points provided on the obtained film circuit board for the dimensional length measurement, which was originally approximately 283 mm (distance of 200 mm in the x direction and distance of 200 mm in the y direction) in the diagonal line direction, was measured and was compared to the result obtained before the peeling, the change in distance was within ±20 µm, the strain was very small, and hence an excellent result was obtained. In this example, since the solder resist layer used as the peeling-assist layer can be used as a solder resist after the peeling, it is not necessary to remove it.

EXAMPLE 5

A circuit pattern was obtained in the same manner as that in EXAMPLE 1.

Next, in the same manner as that in EXAMPLE 2, the IC chips were metal-bonded to the connection pads of the circuit pattern. The alignment of the model IC chips with the connection pads of the circuit pattern was satisfactorily performed.

In the same manner as that in EXAMPLE 2, using the peeling apparatus shown in FIG. 2(a), the polyimide film provided with the circuit pattern connected to the IC chips was peeled away from the glass substrate except that the peeling-assist layer is not provided. The peel angle between the reinforcing plate and the flexible film was up to 40° in peeling. In the polyimide film provided with the circuit pattern obtained after the peeling, folding and cracking were not observed, and the result was excellent. Slight curling was observed at the lead wire portion extending from the connection pad, but the degree of curling was an acceptable level.

When the distance between the two points provided on the obtained film circuit board for the dimensional length measurement, which was originally approximately 283 mm (distance of 200 mm in the x direction and distance of 200 mm in the y direction) in the diagonal line direction, was measured and was compared to the result obtained before the peeling, the change in distance was within ±20 µm, the strain was very small, and hence an excellent result was obtained.

EXAMPLE 6

A circuit pattern was obtained in the same manner as that in EXAMPLE 1 except for the following procedure. That is, a mixture of a weak adhesive removable agent "Oribain" EXKO1-257 (manufactured by Toyo Ink Mfg. Co., Ltd.) and a curing agent BXX5134 (manufactured by Toyo Ink Mfg. Co., Ltd.) at a mixing ratio of 7 to 1 was applied as the removable organic layer, followed by drying at 100° C. for 30 seconds, so that the thickness of the removable agent after drying was set to 5 µm. Next, in the same manner as that in EXAMPLE 2, the IC chips were metal-bonded to the connection pads of the circuit pattern. The alignment of the model IC chips with the connection pads of the circuit pattern was satisfactorily performed.

In the same manner as that in EXAMPLE 2 except that the peeling-assist layer was not provided, using the peeling apparatus shown in FIG. 2(a), the polyimide film provided with the circuit pattern connected to the IC chips was peeled away from the glass substrate. The peel angle between the reinforcing plate and the flexible film was up to 40° in peeling. In the polyimide film provided with the circuit pattern obtained after the peeling, bending and cracking were not observed, and the result was excellent. Slight curling was observed at the lead wire portion extending from the connection pad, but the degree of curling was an acceptable level.

When the distance between the two points provided on the obtained film circuit board for the dimensional length measurement, which was originally approximately 283 mm (distance of 200 mm in the x direction and distance of 200 mm in the y direction) in the diagonal line direction, was measured and was compared to the result obtained before the peeling, the change in distance was within ±20 µm, the strain was very small, and hence an excellent result was obtained.

EXAMPLE 7

A polyimide film provided with the circuit pattern connected to the IC chips was obtained in the same manner as that in EXAMPLE 5 except that a polyimide film having a thickness of 25 µm and a size of 300 by 302 mm ("UPILEX" 25S manufactured by Ube Industries, Ltd.) was used as the flexible film. The peel angle between the reinforcing plate and the flexible film was up to 40° in peeling. In the polyimide film provided with the circuit pattern obtained after the peeling, bending and cracking were not observed, and the result was excellent. Slight curling was observed at the lead wire portion extending from the connection pad, but the degree of curling was an acceptable level.

When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 µm, the strain was very small, and hence an excellent result was obtained.

EXAMPLE 8

A polyimide film provided with the circuit pattern connected to the IC chips was obtained in the same manner as that in EXAMPLE 5 except that alumina having a thickness of 1 mm and a size of 300 by 300 mm was used as the reinforcing plate.

The peel angle between the reinforcing plate and the flexible film was up to 40° in peeling. In the polyimide film provided with the circuit pattern obtained after the peeling, folding and cracking were not observed, and the result was excellent. Slight curling was observed at the lead wire portion extending from the connection pad, but the degree of curling was an acceptable level.

When the distance between the two points provided on the peeled polyimide film for the length measurement, which was originally approximately 283 mm (distance of 200 mm in the x direction and distance of 200 mm in the y direction) in the diagonal line direction, was measured, the change in distance with respect to the photomask pattern was within ±20 µm, the strain was very small, and hence an excellent result was obtained.

EXAMPLE 9

A polyimide film provided with the circuit pattern connected to the IC chips was obtained in the same manner as that in EXAMPLE 5 except that the curvature radius of the curved surface of the holding portion 14 was set to 70 mm. The peel angle between the reinforcing plate and the flexible film was up to 70° in peeling.

Folding and cracking were not observed by peeling, and the result was excellent. Slight curling was observed at the lead wire portion of the circuit pattern on the polyimide film, but the degree of curling was an acceptable level.

When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 μm, the strain was very small, and hence an excellent result was obtained.

EXAMPLE 10

A polyimide film provided with the circuit pattern connected to the IC chips was obtained in the same manner as that in EXAMPLE 5 except that the curvature radius of the curved surface of the holding portion 14 was set to 1,200 mm. The peel angle between the reinforcing plate and the flexible film was up to 10° in peeling. In the circuit pattern on the polyimide film, deformation such as folding and curling was not observed by peeling, and the result was excellent. However, when the distance between the two points provided on the peeled polyimide film for the dimensional length measurement, which was originally approximately 283 mm (distance of 200 mm in the x direction and distance of 200 mm in the y direction) in the diagonal line direction, was measured, some data showed an increase of up to 26 μm with respect to the photomask pattern.

EXAMPLE 11

A polyimide film provided, with the circuit pattern connected to the IC chips was obtained in the same manner as that in EXAMPLE 5 except that a silicone resin was used for the holding portion 14. The peel angle between the reinforcing plate and the flexible film was up to 30° in peeling. In addition, a 180°-direction peel strength obtained when the polyimide film was peeled away from the holding portion 14 made of a silicone resin was 0.98 N/m.

By peeling, curling, folding and cracking were not observed at the lead wire portion of the circuit pattern on the polyimide film, and the result was excellent. When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 μm, the strain was very small, and hence an excellent result was obtained.

EXAMPLE 12

A circuit pattern was obtained in the same manner as that in EXAMPLE 1.

In the same manner as that in EXAMPLE 2, the IC chips were metal-bonded to the connection pads of the circuit pattern. The alignment of the bumps of the model IC chips with the connection pads of the circuit pattern was preferably performed.

Figure 16A:
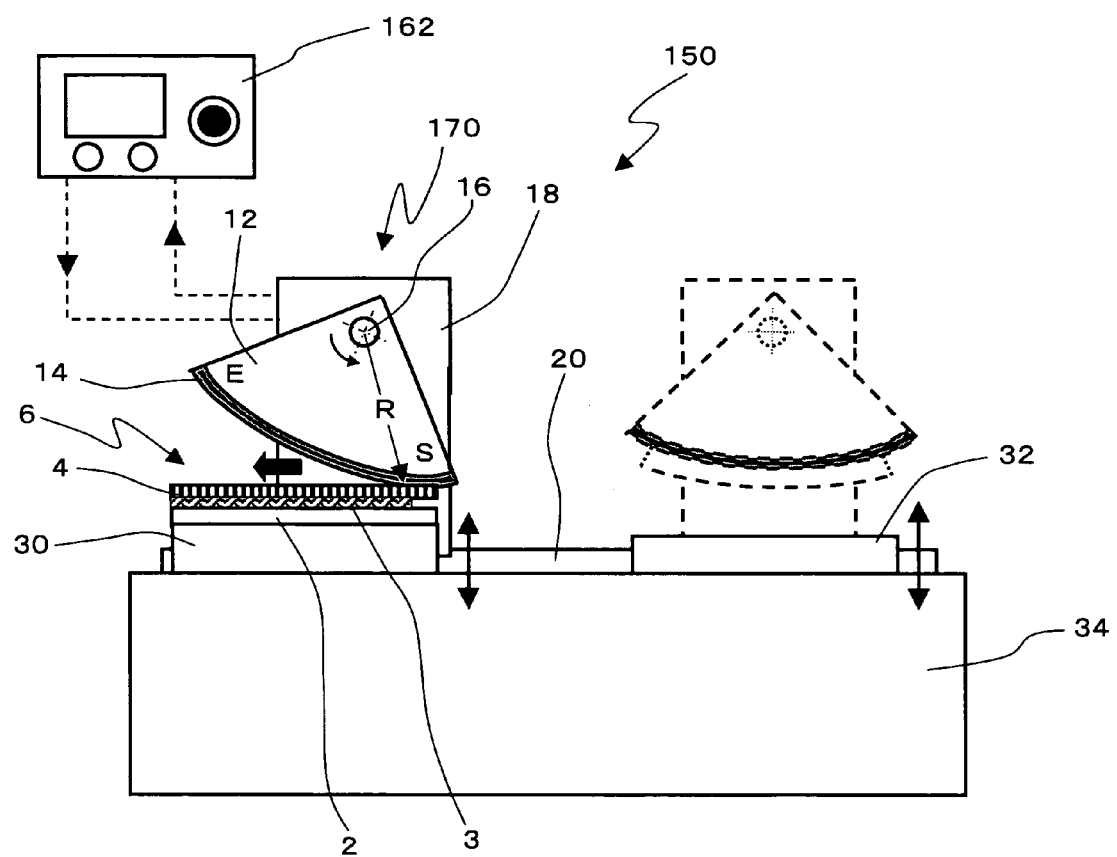
FIGS. 16(a) and 16(b) are a schematic front view and a cross-sectional view, respectively, showing another embodiment of a peeling apparatus according to the present invention.
Figure 16B:
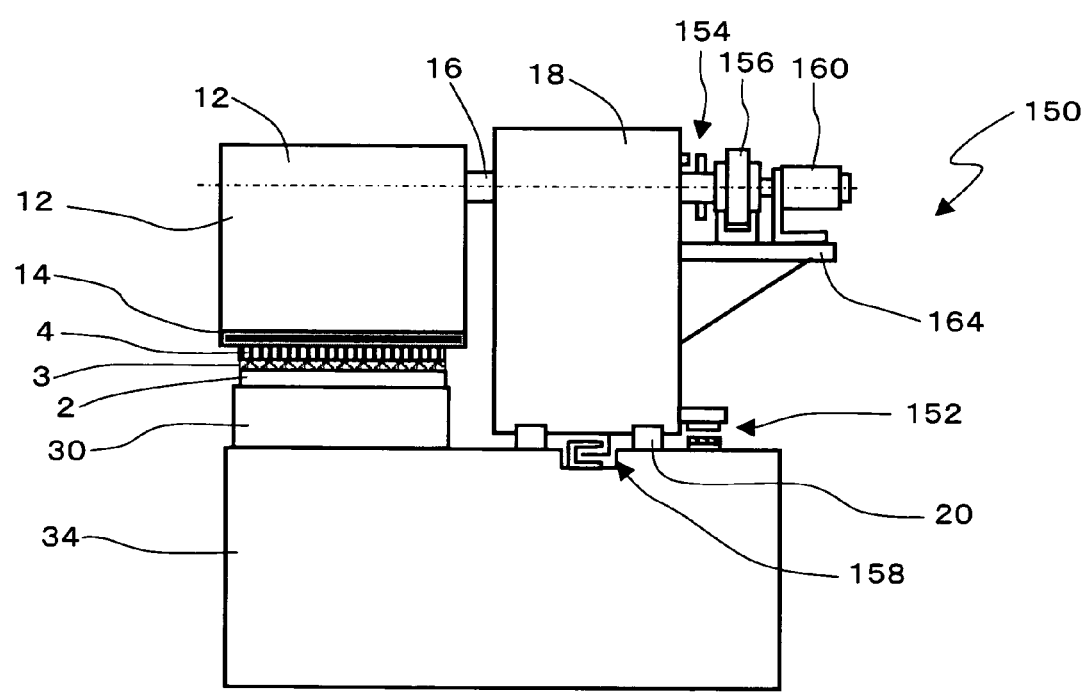

By using the peeling apparatus 150 shown in FIGS. 16(a) and 16(b), the polyimide film provided with the circuit pattern connected to the IC chips was peeled away from the glass substrate. The curvature radius of the curved surface of the holding portion 14 was 600 mm, the degree of vacuum for suction of the flexible film by the holding portion 14 was 100 hPa, and a polyurethane rubber having a hardness of 70° was used as a material for the holding portion 14. In addition, the pressing pressure of the holding portion 14 applied to the flexible film was set to 0.01 MPa, and the rightward relative moving speed V2 of the frame 18 in peeling was set to 0.3 m/minute. In the holding portion 14, the recess portions 36 (5 by 5 mm, depth of 1 mm) corresponding to the IC chips were provided. On the loading table 30, the polyimide film side was placed which was provided with the circuit pattern connected to the IC chips and was vacuum-sucked at 100 hPa. The peel angle between the reinforcing plate and the flexible film was up to 40° in peeling. In addition, the speed of the rotary motor 160 was controlled so that the roll surface speed V1 of the holding surface of the holding portion 14 was set to 0.31 m/minute. Furthermore, the supply voltage to the electromagnetic clutch 156 was adjusted so that the tension per cross-sectional area applied to the polyimide film in peeling was $6.4 \times 10^6$ N/m$^2$ or less, and the peeling was performed. Although the lead wire portion of the circuit pattern on the polyimide film was slightly curled by peeling, folding and cracking were not observed, and hence the result was excellent. When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 μm, and hence an excellent result was obtained.

REFERENCE EXAMPLE 1

A circuit pattern was obtained in the same manner as that in EXAMPLE 1.

In the same manner as that in EXAMPLE 2, the IC chips were metal-bonded to the connection pads of the circuit pattern. The alignment of the bumps of the model IC chips and the connection pads of the circuit pattern was preferably performed.

Except that the speed of the rotation motor 160 was controlled so that the roll surface speed V1 of the holding surface of the holding portion 14 was set to 0.3 m/minute, and that the rightward relative moving speed V2 of the frame 18 in peeling was set to the same as that described above, the peeling was performed in the same manner as that in EXAMPLE 12. In the peeling, the peel angle 38 between the reinforcing plate and the flexible film exceeded 80° nearly at the end of the peeling of the flexible film in some cases, and the flexible film provided with the circuit pattern was strongly curled in the vicinity of a position at which the peeling is almost complete. When the distance between the two points provided on the peeled polyimide film for the dimensional length measurement, which was originally approximately 283 mm (distance of 200 mm in the x direction and distance of 200 mm in the y direction) in the diagonal line direction, was measured, some data showed an increase of up to 30 μm with respect to the photomask pattern.

COMPARATIVE EXAMPLE 1

A circuit pattern was obtained in the same manner as that in EXAMPLE 4, and the model IC chips-were metal-bonded thereto. The glass substrate side was adsorbed to the loading table 30 provided with a vacuum suction mechanism, and a part of the polyimide film protruding from the edge of the glass was held by a hand and was lifted upward in the direction perpendicular to the glass substrate, so that the polyimide film was gradually peeled away from the glass substrate.

At parts on which the model IC chips are mounted, the peeling force for peeling the polyimide film from the substrate is increased, folding was observed in part of the circuit pattern on the polyimide film after the peeling, and as a result, the circuit pattern could not be used as a product. In addition, at parts on which the model IC chips were not mounted, the circuit pattern on the polyimide film was strongly curled after the peeling, and the flatness was degraded.

EXAMPLE 13

A circuit pattern was obtained in the same manner as that in EXAMPLE 2 except that a polyimide film having a thickness of 25 µm and a size of 300 by 298 mm was prepared as the flexible film, that the three sides of the glass and the three sides of the polyimide film were flush with each other, and the remaining one side of the polyimide film was located inside at a distance of 2 mm from the remaining one side of the glass, and that the thickness of the glass was set to 0.55 mm. Subsequently, the model IC chips were metal-mounted to the circuit pattern.

By using the peeling apparatus shown in FIG. 11, the polyimide film provided with a circuit pattern was peeled away from the glass substrate. The curvature radius of the curved surface of the holding portion 65 was 600 mm, and a polyurethane rubber having a hardness of 70° was used as a material for the holding portion 65. A sample was placed on the loading table 61 so that the polyimide film having the IC bonded thereto was brought into contact therewith and was fixed by vacuum suction at 100 hPa. The pressing pressure of the holding portion 65 to the flexible film was set to 0.01 MPa, and the rightward relative moving speed of the frame 66 in peeling was set to 0.3 m/minute. In the loading table 61, the recess portions 90 (5 by 5 mm, depth of 1 mm) corresponding to the IC chips were provided. In the polyimide film provided with the circuit pattern after the peeling, folding, cracking, and curling were not observed, and hence the result was excellent.

When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 µm, the strain was very small, and hence an excellent result was obtained.

EXAMPLE 14

In the same manner as that in EXAMPLE 13, a circuit pattern was obtained. Next, except that the curvature radius of the curved surface of the holding portion 65 was set to 1,200 mm, in the same manner as that in EXAMPLE 13, the glass substrate was peeled away from the polyimide film provided with the circuit pattern connected to the IC chips. However, with respect to the movement of the holding portion 65, the progress of the peeling delayed in some cases. In addition, the peeling was not performed until the end of the polyimide film in some cases.

In the polyimide film provided with the circuit pattern which was obtained after the peeling, folding, cracking, and curling were not observed, and hence the result was excellent.

When the distance between the two points provided on the peeled polyimide film for the dimensional length measurement, which was originally approximately 283 mm (distance of 200 mm in the x direction and distance of 200 mm in the y direction) in the diagonal line direction, was measured, the change in distance with respect to the photomask pattern was within ±20 µm, the strain was very small, and hence an excellent result was obtained.

EXAMPLE 15

Except that a polyimide film having a thickness of 25 µm and a size of 300 by 298 mm was prepared as the flexible film, and that the three sides of the glass and the three sides of the polyimide film were flush with each other, and the remaining one side of the polyimide film was located inside at a distance of 2 mm from the remaining one side of the glass, in the same manner as that in EXAMPLE 2, a circuit pattern was obtained, followed by metal-bonding of the model IC chips thereto.

By using the apparatus shown in FIGS. 14(*a*), 14(*b*), and 15, a wedge having a single-edged blade was inserted between the polyimide film and the removable organic layer, so that the polyimide sheet was gradually peeled away from the glass substrate. The blade-edge angle of the single-edged blade was 10°, and the moving speed of the loading table was set to 0.3 m/minute. The peel angle between the reinforcing plate and the flexible film was up to 40° in peeling. In the polyimide film provided with the circuit pattern after the peeling, folding and cracking were not observed. At the lead wire portion extending from the connection pad, slight curling was observed, but the degree of curling was an acceptable level.

When the distance between the two points provided on the peeled polyimide film for the dimensional length measurement, which was originally approximately 283 mm (distance of 200 mm in the x direction and distance of 200 mm in the y direction) in the diagonal line direction, was measured and was compared to that measured before peeling, the change in distance was within ±20 µm, the strain was very small, and hence an excellent result was obtained.

EXAMPLE 16

In EXAMPLE 15, before peeling, the flexible film substrate 6 on the loading table 103 was heated to 150° C. using an infrared lamp. The resistance in peeling was decreased as compared to that in EXAMPLE 7, and a residue of the pressure-sensitive adhesive on the surface of the polyimide sheet obtained by the peeling was not observed at all. The peel angle between the reinforcing plate and the flexible film was up to 30° in peeling. In the polyimide film provided with the circuit pattern after peeling, folding, cracking, and curling were not observed, and hence the result was excellent.

When the distance between the two points provided on the obtained film circuit board for the dimensional length measurement, which was originally approximately 283 mm (distance of 200 mm in the x direction and distance of 200 mm in the y direction) in the diagonal line direction, was measured and was compared to that measured before peeling, the change in distance was within ±20 µm, the strain was very small, and hence an excellent result was obtained.

INDUSTRIAL APPLICABILITY

The circuit board of the present invention can be preferably used for wiring boards for electronic devices, interposers for IC packaging, wiring boards for wafer-level burn-in socket, and the like.

TABLE 1

| | | EXAMPLE | | | | | | | |
|---|---|---|---|---|---|---|---|---|---|
| | 1 | 2 | 3 | 4 | 5 | 6 | 7 | 8 | 9 |
| FLEXIBLE FILM | | | | 100EN | | | 25S | 100EN | |
| REMOVABLE ORGANIC LAYER | | SW-22 (2 μm) | | | | EX01-257 (2 μm) | | SW-22 (2 μm) | |
| REINFORCING PLATE | | | SODA GLASS 1.1 mm | | | | | ALUMINA 1 mm | SODA GLASS 1.1 mm |
| PEELING-ASSIST LAYER | PVA | | SN-9000 | NPR-90 | | | | NO | |
| MOUNTING OF IC CHIPS | NO | | | | | YES | | | |
| PEELING APPARATUS | | | | | | FIG. 2(a) | | | |
| ROLL CURVATURE RADIUS — HOLDING PORTION | | | | | | 600 mm | | | 70 mm |
| ROLL CURVATURE RADIUS — REINFORCING PLATE | — | — | — | — | — | — | — | — | — |
| BLADE-EDGE ANGLE OF WEDGE-SHAPED PEELING MEMBER | — | — | — | — | — | — | — | — | — |
| DIFFERENCE IN SPEED | | | | | | 0.31/0.3 | | | |
| ABSORPTION OF STEP OF IC | — | | | | | RECESS | | | |
| LAYER HAVING TACKINESS | | | | | | NO | | | |
| MAXIMUM PEEL ANGLE | | | 20° | | | | 40° | | 70° |
| HEATING OF CIRCUIT MEMBER | | | NO | | | | | | |
| ACCURACY AFTER PEELING | | | ≦20 μm | | | | | | |
| CURLING, BENDING | | | NO | | | | SLIGHT CURLING | | |

| | EXAMPLE | | | REFERENCE EXAMPLE | COMPARATIVE EXAMPLE | EXAMPLE | | | |
|---|---|---|---|---|---|---|---|---|---|
| | 10 | 11 | 12 | 1 | 1 | 13 | 14 | 15 | 16 |
| FLEXIBLE FILM | | | | 100EN | | | | | |
| REMOVABLE ORGANIC LAYER | | | | SW-22 (2 μm) | | | | | |
| REINFORCING PLATE | | SODA GLASS 1.1 mm | | | | SODA GLASS 0.55 mm | | SODA GLASS 1.1 mm | |
| PEELING-ASSIST LAYER | | | | NO | | | | | |
| MOUNTING OF IC CHIPS | | | | YES | | | | | |
| PEELING APPARATUS | FIG. 2(a) | | FIGS. 16(a)(b) | | NO | FIG. 11 | | FIGS. 14(a)(b), FIG. 15 | |
| ROLL CURVATURE RADIUS — HOLDING PORTION | 1,200 mm | | 600 mm | | — | — | — | — | — |
| ROLL CURVATURE RADIUS — REINFORCING PLATE | — | — | — | — | — | 600 mm | 1,200 mm | — | — |
| BLADE-EDGE ANGLE OF WEDGE-SHAPED PEELING MEMBER | — | — | — | — | — | — | — | 10° | |
| DIFFERENCE IN SPEED | | 0.31/0.3 | | 0.3/0.3 | — | 0.3/0.3 | | — | — |
| ABSORPTION OF STEP OF IC | | RECESS | | | — | RECESS | | — | — |
| LAYER HAVING TACKINESS | NO | YES | NO | | — | NO | | — | — |
| MAXIMUM PEEL ANGLE | 10° | 30° | 40° | >80° | PEELING BY HAND AT ABOUT 90° | — | — | 40° | 30° |

TABLE 1-continued

| | | | | | | | | |
|---|---|---|---|---|---|---|---|---|
| HEATING OF CIRCUIT MEMBER | | | | NO | | | | 150° C. |
| ACCURACY AFTER PEELING | ELONGATION UP TO 26 μm | ≤20 μm | ELONGATION UP TO 30 μm | NO DESCRIPTION | | | ≤20 μm | |
| CURLING, BENDING | NO | SLIGHT CURLING | STRONG CURLING AT END OF PEELING | GENERATION OF CURLING AND BENDING | NO | NO*[1] | SLIGHT CURLING | NO |

*[1] DELAY OF PEELING, PEELING NOT COMPLETED IN SOME CASES

The invention claimed is:

1. A method for forming a circuit board comprising the step of: peeling a flexible film from a circuit board-use member which comprises the flexible film having a circuit pattern formed on one surface thereof, and a reinforcing plate having dimensional stability adhered to the opposite surface of the flexible film to said one surface with a removable organic layer interposed therebetween, wherein the flexible film is peeled away from the reinforcing plate while a peel angle is being maintained in the range of more than 0° to 80°; and wherein the reinforcing plate is an inorganic glass selected from the group consisting of soda-lime glass, borosilicate glass, and quartz glass; a ceramic selected from the group consisting of alumina, silicon nitride, and zirconia; a metal plate where the metal is selected from the group consisting of stainless steel, invar alloy and titanium; or a glass-fiber reinforced resin sheet.

2. The method for forming a circuit board, according to claim 1, wherein the circuit board-use member further comprises a peeling-assist layer formed on the flexible film, and the flexible film is peeled away from the reinforcing plate.

3. The method for forming a circuit board, according to claim 2, wherein the peeling-assist layer comprises a solder resist.

4. The method for forming a circuit board, according to claim 1, wherein the flexible film is peeled away from the reinforcing plate while the flexible film is being placed along a curved support body or the reinforcing plate is being curved.

5. The method for forming a circuit board, according to claim 4, wherein the curved support body or the curved reinforcing plate has a curvature radius in the range of 20 to 1,000 mm.

6. The method for forming a circuit board, according to claim 4, wherein the flexible film is peeled away from the reinforcing plate while the flexible film or the reinforcing plate is being curved.

7. The method for forming a circuit board, according to claim 4, wherein the flexible film which is placed along the curved support body is peeled away from the reinforcing plate by relatively moving the curved support body with respect to the reinforcing plate while the curved support body is being rotated, a roll surface speed V1 of a flexible film-support surface of the support body is set larger than a relative moving speed V2 of the support body with respect to the reinforcing plate, and a tension per unit cross-sectional area applied to the flexible film when the flexible film is peeled is controlled to be $2.4 \times 10^7$ N/m² or less.

8. The method for forming a circuit board, according to claim 1, wherein the flexible film is peeled away from the reinforcing plate by inserting a wedge-shaped peeling member between the reinforcing plate and the flexible film.

9. The method for forming a circuit board, according to claim 1, wherein an electronic component is bonded to the circuit pattern when the peeling is performed.

10. The method for forming a circuit board, according to claim 1, wherein the circuit board-use member is heated when the peeling is performed.

11. A circuit board formed by the method according to claim 1.

* * * * *